United States Patent
Sarakinos et al.

(10) Patent No.: US 10,378,099 B2
(45) Date of Patent: Aug. 13, 2019

(54) METHOD OF COATING A SUBSTRATE SO AS TO PROVIDE A CONTROLLED IN-PLANE COMPOSITIONAL MODULATION

(71) Applicant: MIMSI MATERIALS AB, Linköping (SE)

(72) Inventors: Konstantinos Sarakinos, Linkoping (SE); Daniel Magnfalt, Linkoping (SE)

(73) Assignee: MIMSI MATERIALS AB, Linkoping (SE)

( * ) Notice: Subject to any disclaimer, the term of this patent is extended or adjusted under 35 U.S.C. 154(b) by 282 days.

(21) Appl. No.: 15/113,099

(22) PCT Filed: Feb. 13, 2014

(86) PCT No.: PCT/EP2014/052831
§ 371 (c)(1),
(2) Date: Jul. 21, 2016

(87) PCT Pub. No.: WO2015/120893
PCT Pub. Date: Aug. 20, 2015

(65) Prior Publication Data
US 2016/0340774 A1    Nov. 24, 2016

(51) Int. Cl.
*C23C 14/06* (2006.01)
*C23C 14/28* (2006.01)
(Continued)

(52) U.S. Cl.
CPC ...... *C23C 14/3485* (2013.01); *C23C 14/0641* (2013.01); *C23C 14/0688* (2013.01);
(Continued)

(58) Field of Classification Search
CPC .............. C23C 14/3485; C23C 14/325; C23C 14/3464
See application file for complete search history.

(56) References Cited

U.S. PATENT DOCUMENTS 7,282,268 B2   10/2007   Fukutani et al.
7,872,253 B2    1/2011   Ohta et al.
(Continued)

FOREIGN PATENT DOCUMENTS

CN   101238243 A   8/2008
CN   102951853 A   3/2013
(Continued)

OTHER PUBLICATIONS

Siozios, A., et al., "Optical Encoding by Plasmon-Based Patterning: Hard and Inorganic Materials Become Photosensitive", "Nano Letters", Jan. 11, 2012, pp. 259-263, vol. 12, No. 1.

*Primary Examiner* — John J Brayton
(74) *Attorney, Agent, or Firm* — Hultquist, PLLC; Steven J. Hultquist

(57) ABSTRACT

A method is described for coating a substrate to provide a controlled in-plane compositional modulation, in which first and second targets are activated, with one of the targets being activated by a series of activation pulses to release particles by pulsed evaporation, sublimation, or sputtering that impinge onto the substrate for coating thereof, while the other one of the targets is substantially passive. The first and second target materials or material compositions present (i) a homologous temperature, defined as a ratio of the substrate temperature to the target material or material composition melting temperature of the target material or material composition having the lowest melting temperature, (ii) a miscibility defined by a mixing enthalpy of the target materials or material compositions, wherein the mixing enthalpy of the materials or material compositions greater than zero is defined as immiscible and a mixing enthalpy of the materials or material compositions less than zero is defined as miscible, and (iii) two-dimensional or three-dimensional growth.

22 Claims, 27 Drawing Sheets

(51) Int. Cl.
*C23C 14/32* (2006.01)
*C23C 14/34* (2006.01)

(52) U.S. Cl.
CPC ............ *C23C 14/28* (2013.01); *C23C 14/325* (2013.01); *C23C 14/3464* (2013.01)

(56) References Cited

U.S. PATENT DOCUMENTS

| | | |
|---|---|---|
| 2002/0189938 A1 | 12/2002 | Baldwin et al. |
| 2005/0053773 A1 | 3/2005 | Fukutani et al. |
| 2006/0266442 A1 | 11/2006 | Narayan et al. |
| 2006/0272949 A1 | 12/2006 | Detor et al. |
| 2007/0275179 A1* | 11/2007 | Astrand .............. C23C 14/0641 427/524 |
| 2008/0191203 A1 | 8/2008 | Fujioka et al. |
| 2013/0056348 A1 | 3/2013 | Papa et al. |
| 2013/0209762 A1 | 8/2013 | Damm et al. |

FOREIGN PATENT DOCUMENTS

| | | |
|---|---|---|
| JP | 2004223695 A | 8/2004 |
| JP | 2006080293 A | 3/2006 |
| JP | 2010241638 A | 10/2010 |
| JP | 2013043827 A | 3/2013 |
| JP | 2013053369 A | 3/2013 |
| WO | 2006080586 A1 | 8/2006 |
| WO | 2007132782 A1 | 11/2007 |
| WO | 2013045454 A2 | 4/2013 |

\* cited by examiner

Figure 1. (a) Island nucleation. (b) Island growth. (c) Island shape preservation during growth

| AlN-Ag ($N^{Ag}=10^3$, $N^{Al}=7.5\times10^4$) |
|---|
| AlN (buffer layer, 500Å) |
| AlN-Ag ($N^{Ag}=2$, $N^{Al}=150$) |
| AlN (buffer layer, 500Å) |
| AlN-Ag ($N^{Ag}=10$, $N^{Al}=7.5\times10^2$) |
| AlN (buffer layer, 500Å) |
| AlN-Ag ($N^{Ag}=10^2$, $N^{Al}=7.5\times10^3$) |
| AlN (buffer layer, 500Å) |
| AlN-Ag ($N^{Ag}=10^4$, $N^{Al}=7.5\times10^5$) |
| AlN (buffer layer, 500Å) |
| AlN-Ag ($N^{Ag}=10^3$, $N^{Al}=7.5\times10^4$) |
| AlN (buffer layer, 500Å) |
| SiO$_2$ (3000 Å) |
| Si (100) |

Fig. 15

METHOD OF COATING A SUBSTRATE SO AS TO PROVIDE A CONTROLLED IN-PLANE COMPOSITIONAL MODULATION

CROSS-REFERENCE TO RELATED APPLICATION

This application is a U.S. national phase under the provisions of 35 U.S.C. § 371 of International Patent Application No. PCT/EP2014/52831 filed Feb. 13, 2014. The disclosures of such international patent application and PCT priority patent application are hereby incorporated herein by reference in their respective entireties, for all purposes.

TECHNICAL FIELD

The present disclosure relates to a method and system for coating a substrate, and more particularly to a method and system which provide the opportunity of controlling the compositional modulation and which are suitable for use in large scale production of coatings.

The present disclosure also relates to a material which can be produced by the disclosed method and system.

BACKGROUND

Various techniques are known for providing coated substrates such as cutting elements, semiconductors, connectors and optical devices, but also decorative surfaces. Known methods include cathodic arc evaporation, electron beam and thermal evaporation, pulsed laser deposition and sputter deposition.

WO2013045454A2 discloses a process and device for providing a substrate with a $Ti_{1-x}Al_xN$ coating, wherein a pair of sputtering targets are used and provided with electrical power having different peak current densities. The sputtering targets are activated at the same time, thus providing a co-deposition, i.e. a mixture of the two materials.

Materials having particular atomic arrangements, frequently referred to as "compositional modulations", are of particular interest, as they may potentially provide enhanced properties in terms of mechanical, optical, electrical, electronic and/or magnetic properties, which may be useful in e.g. the applications mentioned above.

US20020189938A1 discloses a method for performing sputter deposition with multiple targets.

US2006/026442A1 discloses a method for providing a nanostructure, comprising nanodots in a matrix, for a material system wherein the Gibbs free energy of oxidation is greater for the matrix material than for the nanodot material.

In addition to the challenges involved in making these materials as such, there is an additional challenge of providing production methods for such materials that can be used on an industrial scale to provide the materials at reasonable cost, and not only in limited quantities in a research laboratory.

SUMMARY

It is an object of the present disclosure to provide a method and system which enable enhanced control of coating composition and atomic arrangement (i.e, compositional modulation).

A particular object of the present disclosure is to provide a method and system which enable provision of a lateral (i.e., in-plane) compositional modulation.

It is a further object of the present disclosure to provide such methods that can be used on an industrial scale.

The invention is defined by the appended independent claims. Embodiments are set forth in the dependent claims, in the following description and in the drawings.

Generally, there is provided a method of coating a substrate so as to provide a controlled in-plane compositional modulation. The method comprises providing a first target of a first material or material composition, providing a second target of a second material or material composition, different from the first material or material composition, and activating the first and second targets to release particles by evaporation, sublimation or sputtering; and causing the released particles to impinge onto the substrate such that the substrate is coated. Activation of one of the targets includes providing a series of activation pulses, such that pulsed evaporation, sublimation or sputtering of particles is provided, while the other one of the targets is substantially passive. The first and second target materials or material compositions present a respective homologous temperature, defined as a ratio of the substrate temperature to the target material melting temperature of the target material having the lowest melting temperature, a miscibility, as defined by a mixing enthalpy of the target materials or material compositions, wherein the mixing enthalpy of the materials greater than zero is defined as immiscible and a mixing enthalpy of the materials less than zero is defined as miscible; and a two-dimensional or three-dimensional growth mode. When performing the method, the homologous temperature is greater than 0.1 and less than 0.5 and an amount of material deposited per pulse train from each target material is greater than 0.1 monolayer and less than 100 monolayers, preferably less than 50 monolayers, less than 10 monolayers or less than 2 monolayers.

The term "material or material composition" should be understood as the material forming part of a target, and thus which is being evaporated, sublimated or sputtered towards the substrate.

The term "activation" of a target is understood as causing the target to release an amount of material such that at least some of the released material is able to reach, impinge and stick on the substrate.

The term "substantially passive" is understood as the target releasing no or only an insignificant amount of material.

By activating the targets one at a time, it is possible to provide compositional modulation of the resulting coating.

In the method, two-dimensional growth may be achieved if a difference in surface energy between the first and second materials or material compositions is less than 50%, preferably less than 20%, less than 10%, less than 5% or less than 1%, or if the difference in surface energy is greater than that value and the material having the lower surface energy is grown on the material having the higher surface energy, and three-dimensional growth is otherwise achieved.

Hence, while it is difficult to quantify growth kinetics, it should be understood that growth kinetics can also determine growth mode. For example, even if thermodynamics (surface energies) dictate 2D growth sufficiently large deposition rates and sufficiently low growth (substrate) temperatures may hinder interlayer transport (i.e, transport between atomic layers) and thus result in 3D growth. Or if thermodynamics (surface energy) dictate 3D growth sufficiently large deposition rates and sufficiently low growth (substrate) temperatures may result in increase of the nucleation density and thus lead to an apparent 2D growth.

In a first aspect, the target materials are immiscible; the target materials present two-dimensional growth; the homologous temperature is less than 0.4, preferably less than 0.3, or less than 0.2 and an amount of material deposited from each target material per pulse train is less than 2 monolayers.

The homologous temperature is here low enough so as to lead to the formation of metastable solid solution although thermodynamics suggests that the materials are immiscible.

In this aspect, the deposited material may be a ternary nitride with the general form MeAlN, where Me is a transition metal selected from a group consisting of Ti, V, Cr, Zr, Nb, Mo, Hf, Ta, W.

In a second aspect, the target materials are miscible; the target materials present two-dimensional growth; the homologous temperature is less than 0.4, preferably less than 0.3, less than 0.2; and an amount of material deposited from each target material per pulse train is less than 2 monolayers.

The homologous temperature is here low enough so as to prevent intermixing between the materials.

In this aspect, the deposited material may be a metal alloy, such as $Mo_xNb_{1-x}$ or $Cr_xV_{1-x}$, $Pt_xRh_{1-x}$; a semi-metal alloy, such as $Si_{1-x}Ge_x$; a metal nitride, such as $Ti_xZr_{1-x}N_y$ or $V_xNb_{1-x}N_y$; a metal oxide, such as $Zr_xY_{1-x}O_y$; a metal carbide, such as $Ti_xZr_{1-x}C_y$; an antimonide; a phosphide; a boride or a combination thereof.

In a third aspect, the target materials are miscible; the target materials present three-dimensional growth, whereby the first target material presents three-dimensional growth on the second target material and the second material presents two-dimensional growth on the first target material; the homologous temperature is smaller than 0.4, preferably smaller than 0.3 or smaller than 0.2 and an amount of material deposited from each target material per pulse train is less than 50 monolayers, preferably less than 20 monolayers or less than 10 monolayers.

The homologous temperature is here low enough so as to prevent intermixing between the materials.

In this aspect, the deposited material may be a metal alloy, such as $Ag_xPd_{1-x}$; a semi-metal alloy, a metal nitride, such as $Cr_xHf_{1-x}N_y$; a metal oxide, a metal carbide, such as $Mn_xTa_{1-x}C_y$; an antimonide, a phosphide, a boride or a combination thereof.

In the method described above, activation of the first target is achieved by a first activation pulse train consisting of a first number of activation pulses and wherein activation of the second target is achieved by a second activation pulse train consisting of a second number of activation pulses.

The first number of activation pulses may be different from the second number of activation pulses.

The first number of activation pulses may be from 1 to about $10^8$, preferably from 10 to about $10^6$, from 20 to about $10^5$ or from 20 to about $10^4$; and wherein the second number of activation pulses is from 1 to about $10^8$, preferably from 10 to about $10^6$, from 20 to about $10^5$ or from 20 to about $10^4$.

The first number of activation pulses and/or the second number of activation pulses may differ between a pair of after each other provided activation pulse trains applied to the same target.

The pulses forming part of the first activation pulse train may provide a first pulsing frequency of about 1 Hz to about 20 kHz, preferably about 5 Hz to about 10 kHz, about 10 Hz to about 10 kHz, about 5 Hz to about 5 kHz, about 10 Hz to about 5 kHz, about 5 Hz to about 2 kHz, about 10 Hz to about 2 kHz or about 10 Hz to about 2 kHz, about 10 Hz to about 2 kHz.

The pulses forming part of the second activation pulse train may provide a second pulsing frequency of about 1 Hz to about 20 kHz, preferably about 5 Hz to about 10 kHz, about 10 Hz to about 10 kHz, about 5 Hz to about 5 kHz, about 10 Hz to about 5 kHz, about 5 Hz to about 2 kHz, about 10 Hz to about 2 kHz or about 10 Hz to about 2 kHz, about 10 Hz to about 2 kHz.

The first pulsing frequency may be different from the second pulsing frequency.

The first pulsing frequency and/or the second pulsing frequency may differ between a pair of after each other provided activation pulse trains applied to the same target.

The first pulsing frequency may vary during the first pulse train and/or wherein the second pulsing frequency varies during the second pulse train.

The activation pulses forming part of the first activation pulse train may provide a first pulse width of about 1 ns to about 1 ms, preferably about 1 ns to about 1 ms, about 10 µs to about 500 µs, about 50 µs to about 250 µs or about 100 µs.

The pulses forming part of the second activation pulse train may provide a second pulse width of about 1 ns to about 1 ms, preferably about 1 ns to about 1 ms, about 10 µs to about 500 µs, about 50 µs to about 250 µs or about 100 µs.

The first pulse width may be different from the second pulse width.

The first pulse width and/or the second pulse width may differ between a pair of after each other provided activation pulse trains applied to the same target.

The first pulse width may vary during the first pulse train and/or wherein the second pulse width varies during the second pulse train.

The activation pulses may present an amplitude, which, expressed in number of atoms deposited onto the target, may be from about $10^{-5}$ to about 10 monolayers, preferably from about $10^{-5}$ to about 1 monolayers or from about $10^{-4}$ to about $10^{-1}$ monolayers.

The activation pulses may provide a cathode power density of about 1 $Wcm^{-2}$ to about 10 $kWcm^{-2}$.

A delay between activation of one of the targets and activation of the other one of the targets may be approximately zero.

Alternatively, a delay between activation of one of the targets and activation of the other one of the targets may be less than 20% of an activation time of said one of the targets, preferably less than 10%, less than 5% or less than 1% of the activation time.

The method may further comprise providing a third target of a third material or material composition, different from the first material or material composition and different from the second material or material composition; activating the third target to provide a pulsed evaporation, or sublimation or sputtering of particles; and causing the released particles to impinge onto the substrate such that the substrate is coated; wherein activation of the third target includes providing a series of activation pulses while at least one of the first and second targets is substantially passive.

Activating the first, second and third targets, as the case may be, may comprise supplying electrical power to the respective target.

BRIEF DESCRIPTION OF THE DRAWINGS

FIG. 15 illustrates the architecture of a multilayer AlN—Ag stack used to demonstrate the effect of pulse train length on compositional modulation.

FIG. 17) of the multilayer AlN—Ag stack.

DESCRIPTION OF EMBODIMENTS

Figure 1:
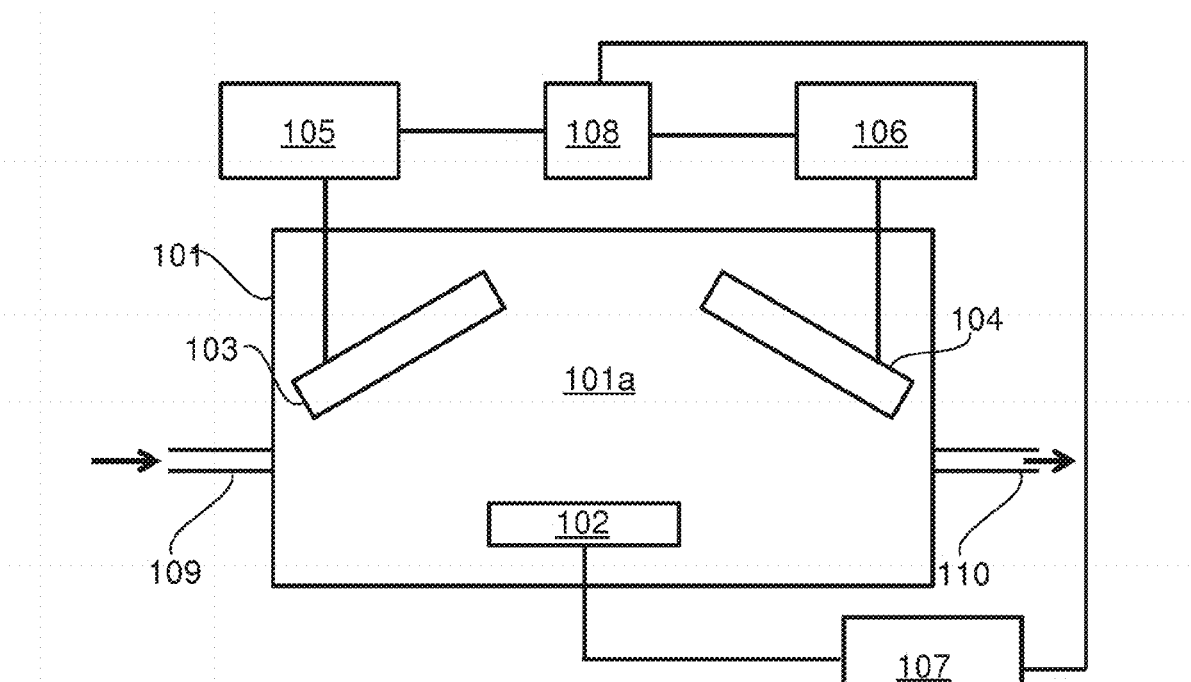
FIG. 1 is a schematic view of a sputtering system.

FIG. 1 is a schematic view of a PVD system according to a first embodiment, wherein a sputtering process is used. The system comprises a reactor vessel 101 enclosing a deposition chamber 1a, in which there is arranged a substrate 102, optionally on a substrate holder (not shown), a first magnetron target (cathode) 103 and a second magnetron target (cathode) 104. The system further comprises a first power supply 105 for supplying power to the first target 103, a second power supply 106 for supplying power to the second target 104 and a third power supply 107 for applying bias potential voltage to the substrate (or to the substrate holder). The system also comprises a synchronization device 108, e.g. in the form of an arbitrary wave function generator or similar, which is used to provide a respective synchronization signal for the power supplies 105, 106, 107.

The system may optionally comprise one or more ports 109, 110 for controlling the environment inside the deposition chamber 101a. For example, one port 109 may be used to provide an inlet for sputter gas or reactive gas and another port 110 may be used to provide an outlet for sputter gas or reactive gas, or for merely controlling a pressure level inside the reaction chamber 101a, e.g. to provide a vacuum.

In the sputtering system described with reference to FIG. 1, the targets may be arranged on a respective magnetron providing an electric and magnetic field, the magnetron being powered by the power supplies 105, 106. The sputtering may take place at vacuum or in the presence of a sputtering gas, such as (Ar, Ne, Xe, Kr). Sputtering processes, such as ion-beam sputtering, reactive sputtering, ion-assisted sputtering, high-target-utilization sputtering, high-power impulse sputtering and gas flow sputtering are known as such and need no further description herein.

Figure 2:
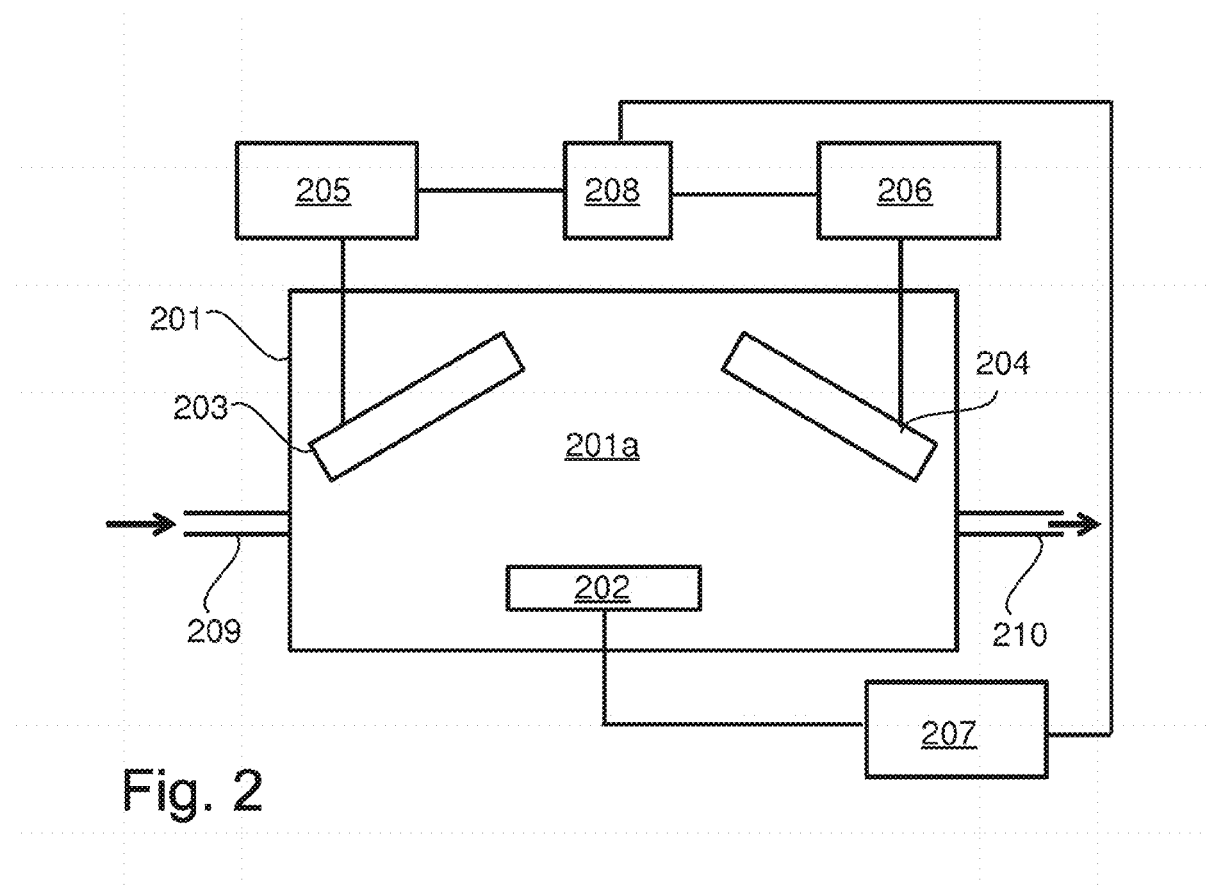
FIG. 2 is a schematic view of a cathodic arc evaporation deposition system.

FIG. 2 is a schematic view of a PVD system according to a second embodiment, wherein a cathodic arc evaporation deposition process is used. The system comprises a reactor vessel 201 enclosing a deposition chamber 201a, in which there is arranged a substrate 202, optionally on a substrate holder (not shown), a first arc cathode 203 and a second arc cathode 204. The system further comprises a first power supply 205 for supplying power to the first arc cathode 203, a second power supply 206 for supplying power to the second arc cathode 204 and a third power supply 207 for applying bias potential voltage to the substrate (or to the substrate holder). The system also comprises a synchronization device 208, e.g. in the form of an arbitrary wave function generator or similar, which is used to provide a respective synchronization signal for the power supplies 205, 206, 207.

The system may optionally comprise one or more ports 209, 210 for controlling the environment inside the deposition chamber 201a. For example, one port 209 may be used to provide an inlet for buffer and/or reactive gas and another port 210 may be used to provide an outlet for buffer and/or reactive gas, or for merely controlling a pressure level inside the deposition chamber 201a, e.g. to provide a vacuum.

In the cathodic arc deposition system as described with reference to FIG. 2, the targets are arranged on the cathodes 203, 204. Cathodic arc deposition processes are known as such and need no further description herein.

Figure 3:
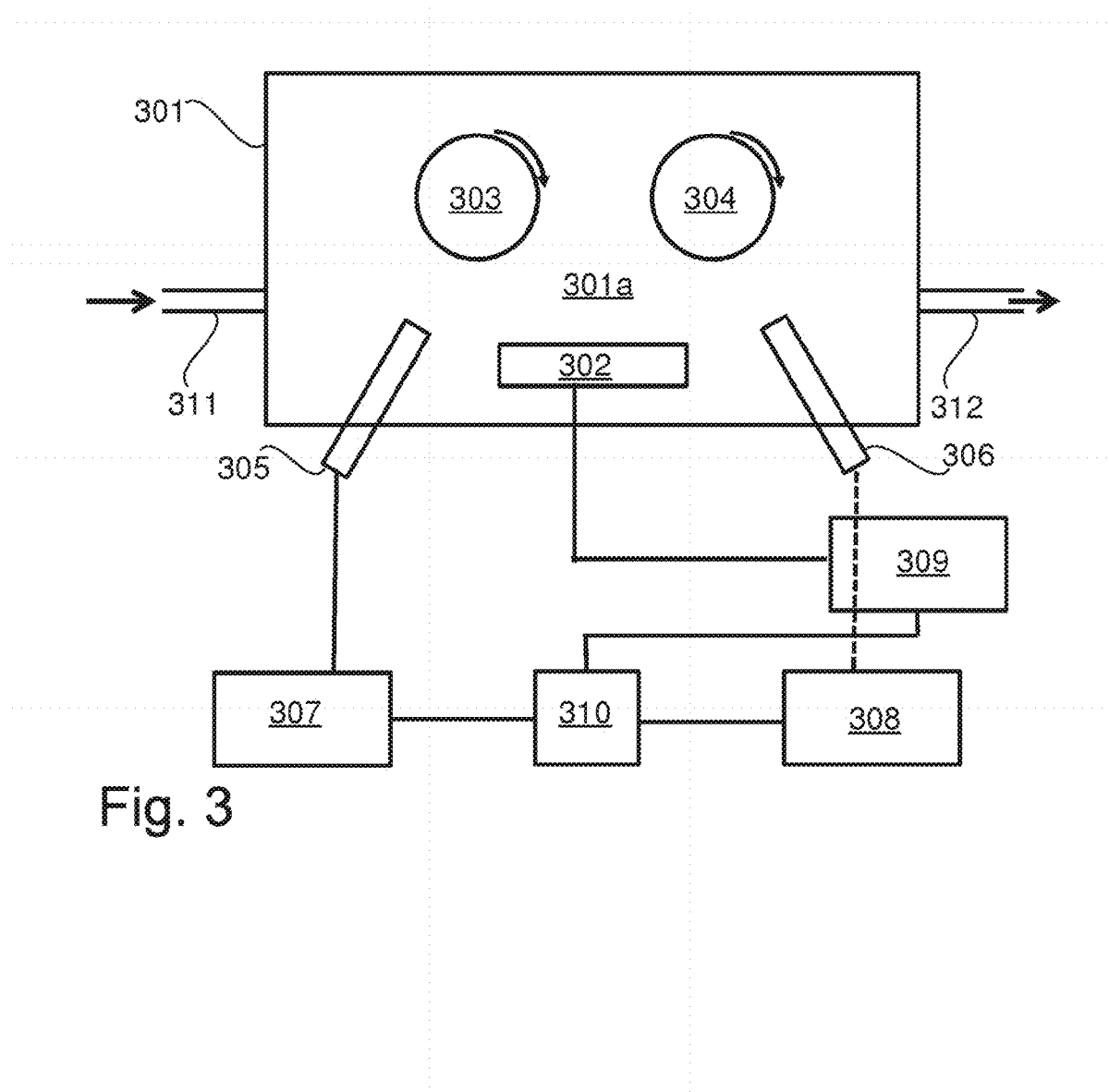
FIG. 3 is a schematic view of a laser ablation deposition system.

FIG. 3 is a schematic view of a PVD system according to a third embodiment, wherein a laser ablation process is used. The system comprises a reactor vessel 301 enclosing a deposition chamber 301a, in which there is arranged a substrate 302, optionally on a substrate holder (not shown), a first target 303 (optionally mounted on a rotating drum) and a second target 304 (optionally mounted on a rotating drum). The system further comprises a first laser apparatus 305, including any control electronics (not shown) and/or optics (not shown) for focusing the first laser 305 onto the first target 303; and a second laser apparatus 306, including any control electronics (not shown) and/or optics (not shown) for focusing the second laser 306 onto the second target 304. The system further comprises a first power supply 307 that feeds the first laser 305, which is focused onto the first target 303; and a second power supply 308 that feeds the second laser 306, which his focused onto the second target 304. The system further comprises a third power supply 309 for applying a bias potential voltage to the substrate 302 or substrate holder and a synchronization device 310, e.g. in the form of an arbitrary wave function generator or similar, which is used to provide a respective synchronization signal for the power supplies 307, 308, 309.

The system may optionally comprise one or more ports 311, 312 for controlling the environment inside the reaction chamber 301a. For example, one port 311 may be used to provide an inlet for buffer and/or reactive gas and another port 312 may be used to provide an outlet for buffer and/or reactive gas, or for merely controlling a pressure level inside the deposition chamber 301a, e.g. to provide a vacuum.

The environment in the deposition chamber 101a, 201a, 301a may be varied by using the ports 109, 110; 209, 210; 311, 312 for introducing and/or extracting gas.

Similarly, temperature control may be applied as deemed necessary.

Figure 4:
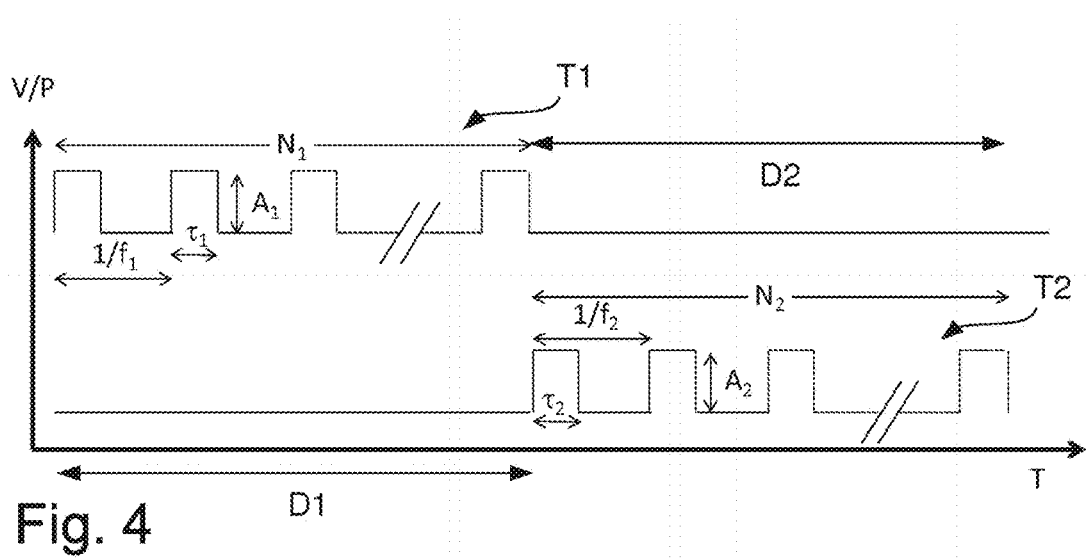
FIG. 4 is a schematic view of pulse trains provided to the targets.

FIG. 4 schematically illustrates pulse trains T1, T2, which can be applied to activate the respective target, e.g. by directly powering the targets 103, 104; 203, 204 or by powering the lasers 305, 306.

Each pulse train T1, T2 is formed of a plurality of pulses, where each pulse train consists of a predetermined number $N_1$, $N_2$ of pulses. The pulse train may be further characterised by a pulsing frequency $f_1, f_2$, with a pulse period being $1/f_1$ and $1/f_2$, respectively; a pulse length $\tau_1$, $\tau_2$ and a pulse amplitude $A_1$, $A_2$.

A first delay D1 is provided between the initiation of the first pulse train T1 and the initiation of the second pulse train T2. The length of the first delay D1 may be approximately the same as the length of the first pulse train T1. Similarly, when the second pulse train T2 is initialized, a second delay D2 is introduced before re-initializing the first pulse train T1. The length of the second delay D2 may be approximately the same as the length of the second pulse train T2.

The number $N_1$, $N_2$ of pulses; pulsing frequency $f_1$, $f_2$, pulse length $\tau_1$, $\tau_2$, pulse amplitude $A_1$, $A_2$ and delays D1, D2 will be referred to as "pulse train parameters".

As yet another pulse train parameter, the shape of the pulse may be varied, e.g. between square (as shown), rectangular, saw tooth, exponential, stepped, exponential, cosine or derivations or combinations of such shapes (e.g. double pulses, bandwidth limited pulses or cosine squared pulses).

The lengths of the delays D1, D2 may vary on the order of +/−20%, preferably +/−10%, +/−5%, +/−1% or +/−0.1%. Hence, there may be a period of overlap, during which both pulse trains T1, T2 are applied to activate the respective target. However, in most there will be no overlap.

The parameters of the pulse train will determine the amount of material (number of atoms) released from the target, and thus available for deposition, during an activation cycle (i.e. application of one pulse train).

The exact amount of material actually deposited during an activation cycle will also depend on the efficiency of the material release process (i.e. sputtering yield, ablation rate, evaporation rate, etc.) and the efficiency of the transport process of material from the target to the substrate. Naturally, the environment in the deposition chamber 101a, 201a, 301a will affect the end result.

It is expected that it will be difficult to provide general universal relationships between the parameters of a pulse train and the material deposited from a cathode during the activation cycle because this is expected to be strongly dependent on the materials used as well as on the particular equipment and other processing parameters (e.g. deposition chamber environment). Hence, for each given combination of materials and processing equipment, the relationship between pulse train parameters and final material configuration will need to be empirically derived.

However, given that these relationships are established for a combination of material and processing equipment, the material deposited per activation cycle from a given cathode will be equal to the product $\tau_i{*}A_i{*}N_i$, where i is the number of material sources (cathode); $A_i$ is expressed in ML/sec (monolayers/second), $\tau_i$ is expressed in sec and $N_i$ is expressed in number of pulses. The product $\tau_i{*}A_i{*}N_i$ is thus expressed in ML of a certain resulting material.

It is understood that the pulse trains T1, T2 may be modified.

For example, one or more of the pulse train parameters may be varied between pulse trains applied at different points in time, or even successively, to one and the same target.

As yet another example, one or more of the pulse train parameters may be varied within the same pulse train.

Figure 5A:
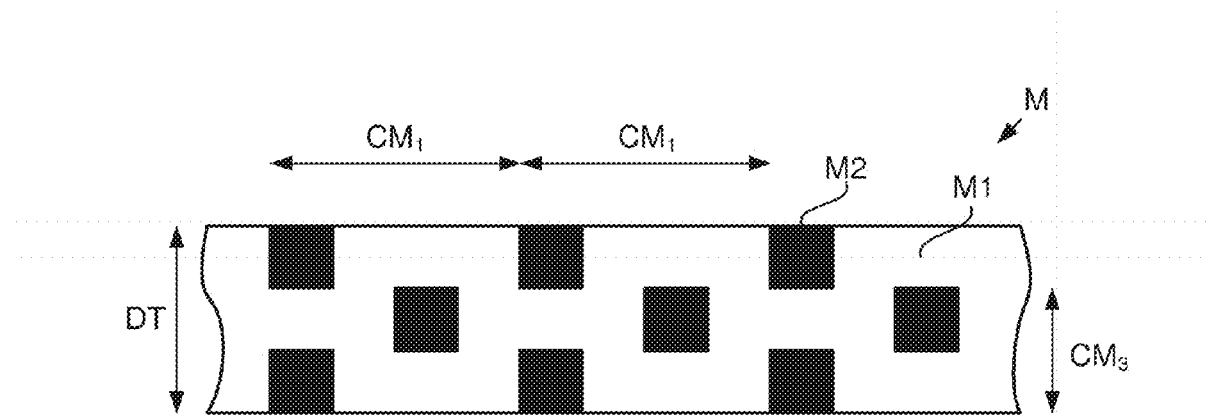
FIGS. 5a-5b are schematic views of a material layer M.

FIG. 5a is a cross sectional view of a material layer M composed of two component materials M1 and M2, where the first component material M1 forms a matrix and the second component material M2 forms regularly distributed inclusions in the matrix material.

Figure 5B:
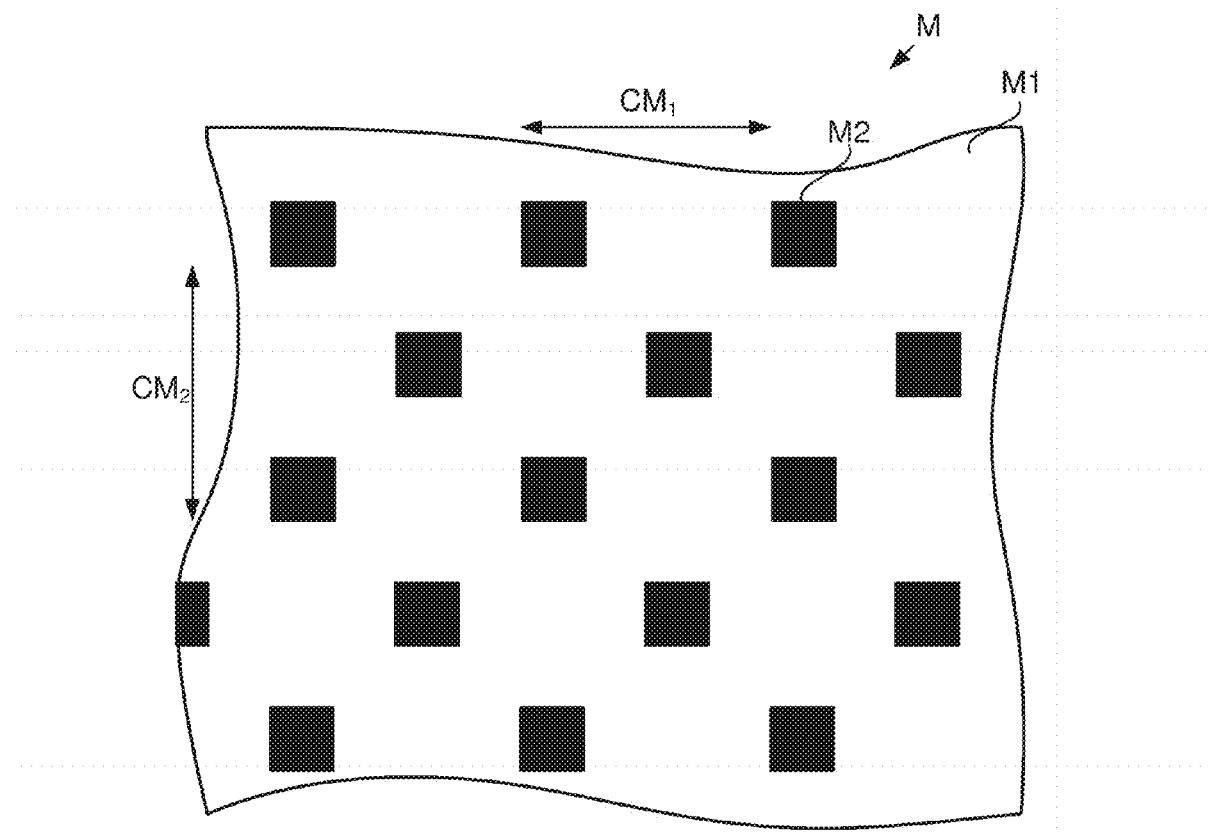

FIG. 5b is a top view of the material layer in FIG. 5a.

The material M presents a lateral compositional modulation of $CM_1$ in a first direction and a lateral compositional modulation $CM_2$ in a second direction. Moreover, the material M may present a compositional modulation $CM_3$ in the thickness direction $D_T$.

The compositional modulations $CM_1$, $CM_2$, $CM_3$ may be substantially the same, or they may differ from each other. In particular, the lateral compositional modulations $CM_1$, $CM_2$ may be substantially the same.

In the systems disclosed above, the substrate and/or the targets may be fixed or movable. For example, moving targets may be used in a per se known manner to provide distributed erosion of the target. Movements of targets and/or substrate may be synchronized with the pulse trains T1, T2.

The biasing provided by the third power source 107, 207, 309 may also be pulsed and synchronized with the pulse trains. Such synchronization may be arranged to take due consideration to e.g. transit times from target to substrate for particles.

The methods disclosed above may be used to provide a material having a lateral compositional modulation, and in some cases also a substantially regular periodicity as seen in a direction perpendicular to a thickness direction of the material. The thickness direction will typically also be the growth direction when the material is being deposited in the PVD system.

Materials or Material Compositons

In addition to the process parameters set forth above, the resulting compositional modulation may be influenced by the two or more materials or material compositions which are being applied.

Miscibility of the Materials or Material Compositions

The miscibility of the materials or material compositions may be determined by their enthalpy of mixing. Thus a negative value of the enthalpy of mixing implies miscibility and a positive value of the enthalpy of mixing implies non-miscibility.

Surface Energy of Materials or Material Compositions and of Substrate

The surface energies of the materials or material compositions and of the substrate may be relevant for the in-plane compositional modulation.

For example, wherein the materials or material compositions have similar surface energies and their surface energies are smaller than or equal to that of the substrate (or of the underlying layer), 2D, or predominantly in-plane, growth can be achieved.

Another example is where one of the materials or material compositions has a greater surface energy than that of the substrate (or of the underlying layer), which allows this material or material composition to grow in 3D, i.e. both in-plane and out-of-plane.

Homologous Temperature

The homologous temperature, i.e. the ratio Ts/Tm of substrate temperature Ts to material or material composition melting point Tm, influences the diffusion characteristics of the process after the material or material composition has impinged on the substrate.

If Ts/Tm is larger than 0.5 (preferably above 0.6 more preferably above 0.7) then bulk diffusion is active and unlimited, which means that depending on whether the materials or material compositions are fully miscible or immiscible the process will result in a uniform solid solution or randomly segregated material or material composition domains respectively.

Ts/Tm values below 0.7, preferably below 0.6 or 0.5, have been found to provide limited bulk mobility and thus a positive effect on the in-plane compositional modulation.

Ts/Tm values below 0.2, or even below 0.1, have been found not to provide any surface diffusion at all, meaning that impinging atoms or molecules reside at the impact site of the substrate or underlining film layer.

At Ts/Tm below 0.2, kinetic conditions cannot be set by deposition rate per pulse, pulsing frequency or pulse width. In-plane compositional modulation is then predominantly determined by the amount of material or material composition deposited per respective pulse train, as determined by the pulse train length, deposition rate per pulse, and pulsing frequency. Also, in this case, miscibility or non-miscibility between the materials or material compositions is not relevant because diffusion and coalescence between different atomic islands is not relevant For homologous temperatures Ts/Tm above 0.1 (preferably above 0.2) and below 0.7 (preferably below 0.6 and more preferably below 0.5), surface diffusion is active.

In one exemplary configuration, with fully miscible materials or material compositions, Ts/Tm between 0.1 and 0.7 and surface energies of the materials or material compositions being greater than that of the substrate, islands of the respective material or material composition can grow in 3D fashion on a substrate.

Increasing Ts/Tm from the low end of the range towards its high end causes intermixing, which reduces in-plane compositional modulation.

On the other hand, reducing Ts/Tm from the high end towards the low end of the range causes segregation/separation between domains of the respective material or material combination.

In another exemplary configuration, with non-miscible materials or material compositions, moving from the low end to the high end of the Ts/Tm range favour segregation of domains of the different materials or material compositions.

On the other hand, when moving from the high end towards the low end of the Ts/Tm ratio in question limited surface diffusion may cause the formation of metastable solid solutions.

In yet another exemplary configuration, islands may be grown on the substrate and each other in a 2-D fashion (this means that the surface energy of materials or material compositions are similar to each other and smaller or equal to that of the substrate). In this case, non-miscibility and miscibility (based on the thermodynamic criteria described above) will have the same effect on composition modulation as in the 3D case, depending on the Ts/Tm value during film synthesis. The difference is that for otherwise identical process conditions, kinetic and thermodynamics conditions of 2D growth will result in a longer characteristic length scale for in-plane compositional modulation.

In another example, one of the materials or material compositions may be grown in a 2D fasion on the substrate and on the other one of the materials or material compositions (i.e. the surface energy of the first material or material composition is smaller than that of the substrate and of the second material or material composition), while the second material is grown in a 3D fashion on the substrate and on the first material or material composition (i.e. the surface energy of the second material or material composition is greater than that of the substrate and of the first material). The 3D islands thus formed will cause a "corrugation". The surface corrugation in combination with diffusivity (if sufficient, i.e., Ts/Tm ratio towards the high end of the range in question is required) and with appropriate selection of process parameters (in terms of pulse train length, pulse width, pulsing frequency, deposition rate per pulse) may result in in-plane and out-of-plane ordering when both miscible and immiscible (e.g., AlN—Ag) materials are used.

Another example is where the melting points Tm of the two materials or material compositions differ substantially. For example, one material or material composition may exhibit substantial diffusivity while the other exhibits little or no diffusivity. This may result in very different characteristic length scales for compositional modulation given the right choice of process conditions.

Proof of Concept—Simulation Model

A Kinetic Monte Carlo (KMC) code has been developed for the purpose of modeling atomic processes and predicting atomic arrangement achieved during deposition of multicomponent films when using the method described herein. The KMC code models three-dimensional and two-dimensional island growth, and in particular the processes of nucleation, growth and coalescence up to the elongation transition (a characteristic thickness during film growth that signifies the transition from a discontinuous to a continuous film) of film growth. The principles of KMC and code implementation are well described in text following textbooks:

P. Kratzer. Monte Carlo and Kinetic Monte Carlo Methods—A Tutorial. In
Multiscale Simul. Methods Mol. Sci. volume 42 pages 51-76. Julich Supercomputing Centre, Julich, (2009)
J. D. Erlebacher. Kinetic Rate Law Issues in the Morphological Relaxation of Rippled Crystal Surfaces. In Dyn. Cryst. Surfaces Interfaces pages 97-107. Plenum Press, New York, (1997).

The purpose of this section is to give a brief description the physical model behind the code starting (for clarity) with the code that models growth of single-component films and then extending the description to processes that include more than one atomic species (i.e., multicomponent films).

Figure 6:
FIGS. 6a-6c are schematic views illustrating the concepts of island nucleation, island growth and island shape preservation during 3-D film growth.

The basic processes during film growth considered in the code are depicted in FIG. 6. During a deposition, atoms arrive onto an empty substrate surface, modeled with a square lattice of a fixed size, and are allowed to diffuse as adatoms at a rate determined by their hopping rate, $$\Gamma = \frac{\alpha^2}{4} \upsilon_0 \exp(-E_D/k_B T) \left[\frac{1}{S}\right] \quad (1)$$

with a $\alpha$[Å] being the minimum lattice spacing of film material, $$\upsilon_0 = 5 \times 10^{12} \left[\frac{1}{S}\right]$$

the vibrational frequency of an adatom and $E_D$ [eV] the substrate diffusion barrier (minimum energy that an adatom has to surpass in order to diffuse (move) on the surface of the substrate during the growth process). The surface diffusion rate can be correlated with the homologous temperature, Ts/Tm, as described above. Since a pulsed vapor is modeled, the arrival rate of atoms is split into square pulses of a fixed length [$\tau$] which repeat at a certain frequency [f]. Also, the amount of atoms deposited per pulse [$F_P$] (corresponding to the quantity $\tau^*$A according the the describption of the pulse trains in FIG. 4) is given in monolayers (Monolayer (ML) which is the amount of atoms needed to form an one-atom thick continuous layer. For metals 1 ML corresponds to approximately $10^{15}$ atoms/cm². Once enough atoms have been deposited, nucleation of islands begins to occur. This can happen either by two adatoms colliding or by a newly deposited atom landing on top or adjacent to an existing adatom (see FIG. 6a-6c). In a similar way, islands may grow either by adatoms diffusing to them or by atoms landing directly on top of them. It should be noted that the simulation does not allow renucleation on top of existing islands. In case that three-dimensional growth is modelled, the shape of the islands in the simulation is restricted to hemispheres with 90° contact angles with the substrate surface and preserved as the islands grow (see FIG. 6c). In case that two dimensional growth is modelled the shape of the islands in the simulation is restricted to disks (not shown in FIG. 6) with 0° contact angle of with the substrate surface and it is preserved during growth. It is assumed that the shapes described above are the equilibrium shapes of sufficiently small islands, for which no facetting occurs.

As the islands increase in number and size, they begin to come into contact with other islands, and coalescence occurs. This is treated as a binary process between pairs of islands, in which the islands will merge together to form a single larger (mass-conserved) island, with the hemispherical shape/disk shape (for 3D/2D growth respectively) preserved here as well. The time for coalescence completion is calculated by $$\tau_{coal} = \frac{R^4}{B} [S] \quad (2)$$

where R is the radius of the smaller island in the pair, and B is a coalescence parameter calculated by $$B = \frac{D_S \gamma \Omega^{4/S}}{k_B T} \left[\frac{m^4}{s}\right] \quad (3)$$

with $D_S$, $\gamma$ and $\Omega$ the self-diffusivity, surface energy and the atomic volume respectively of the film material. Since the coalescence parameter B is largely determined by self-diffusivity rates, B can correlated with the empirical quantity Ts/Tm described above. Since $\tau_{coal}$ is island size dependent, larger islands will take longer to coalesce, thus making the average coalescence time longer as more material is deposited. This gives rise to elongated structures on the surface, comprised of clusters of islands that have impinged but not yet completed their coalescence process. At some point in simulation time, the surface is dominated by such structures, and no more coalescence events are completed. At this point, the elongation transition has been reached. The elongation transition is determined by keeping track of the average size of (island) clusters. When the average cluster sizes increases above two, the elongation transition is considered to have been reached.

In the following the changes in the code and the physical model for simulating growth of multicomponent films is presented. The description is for the case of two atoms/species (atom A and atom B). Extension to more than two species is straightforward. In general, these changes allow for the simulation of deposition "pulse trains" of two different atomic species (A and B). Each pulse train is characterized by a number of pulses ($N_i$), a pulse length [$\tau_i$] which repeat at a certain frequency [$f_i$]. Also, the amount of atoms deposited per pulse [$F_P^i$] is given in monolayers per pulse. The two atomic species can differ by their diffusion barriers ($E_D^i$) towards the substrate and also the coalescence parameter ($B_i$) that they cause upon incorporation into islands. For all the quantities listed above the index "i" denotes either A or B. In this version of the code, the two atom species are completely miscible with each other, therefore all atoms (whether A or B) are treated the same way with respect to incorporation in existing islands. The coalescence time limit ($\tau_{coal}=R^4/B$) is now calculated using a compositionally weighted average $<B>=N_A F_P^A B_A + N_B F_P^B B_B/(N_A F_P^A + N_B F_P^B)$ to account for differences in surface self-diffusivity of the two atomic species. Since the atoms are completely miscible, all islands are treated the same with regards to coalescence, irrespective of their composition.

The simulation output includes "snapshots" depicting islands (no monomers) at every 0.05 ML of simulated deposition. At the same time, a composition map of the simulation surface is produced which depicts in 3-D fashion the composition distribution of A and B atoms (see FIGS. 7a, 7b). Since atomic arrangement within an island is not considered, this map depicts the relative average fraction (between 0 and 1) of each atom (A and B) within each island.

Figure 7A:
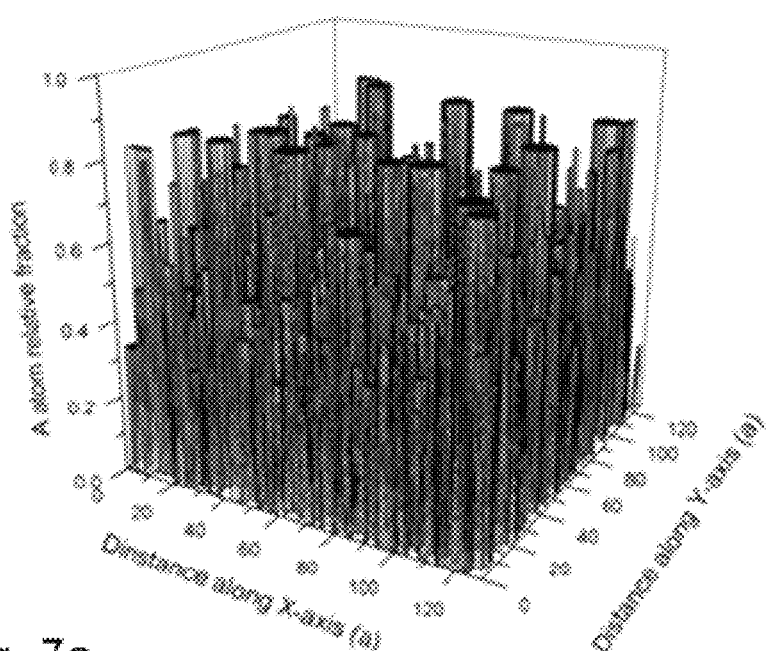
FIGS. 7a-7b schematically illustrate 3-D compositional maps of A and B atoms on the simulation surface.
Figure 7B:
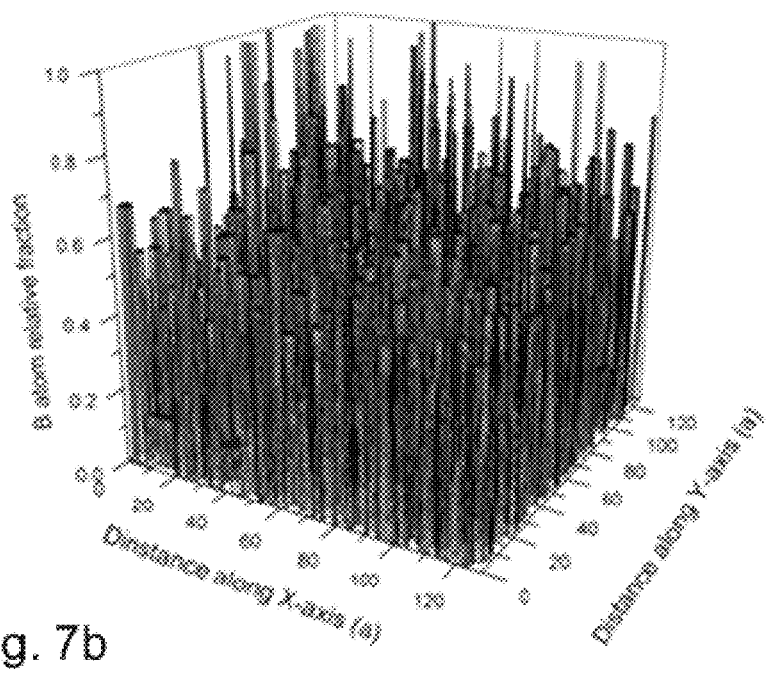

In FIGS. 7a, 7b, there is illustrated average relative fraction (between 0 and 1) of each atom (A and B) within each island. The simulation parameters are: $N_A=N_B=3\times10^3$ pulses, $f_A=f_B=1000$ Hz, $F_P^A=F_P^B=10^{-4}$ ML, $\tau_A=\tau_B=100$ µS, $B_A=B_B=500$ a⁴ s⁻¹. $E_D^A=0.3$ eV and $E_D^B=0.8$ eV.

Figure 8:
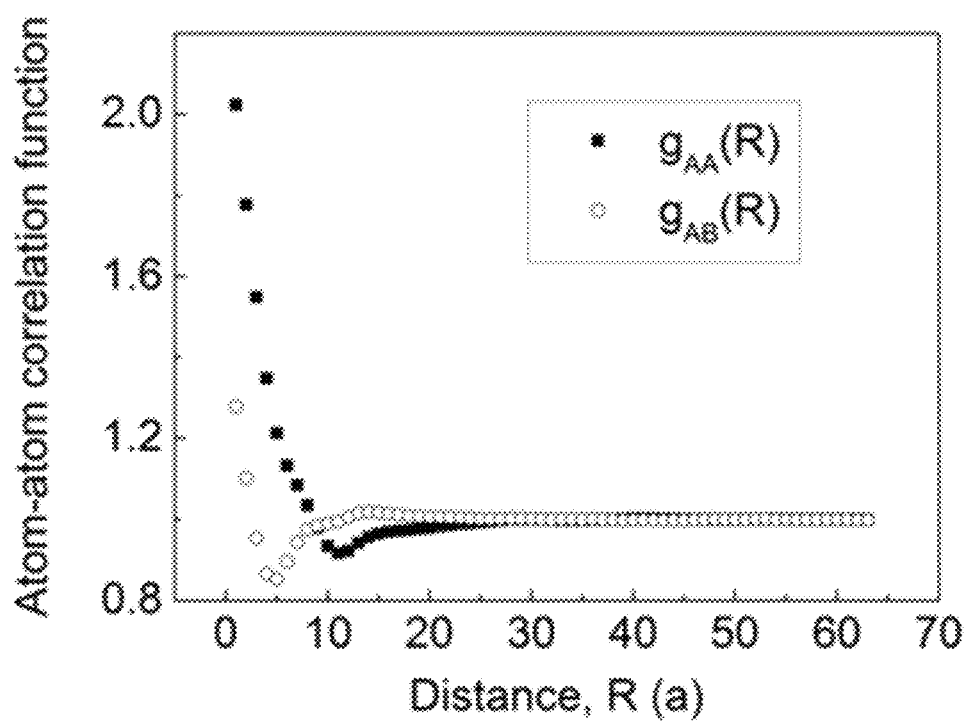
FIG. 8. A-A and A-B pair correlation function ($g_{AA}(R)$ and $g_{BB}(R)$, respectively) extracted from a characteristic simulation.

To quantify the composition maps, A-A atoms and A-B atoms pair correlation functions (or simply correlation functions) were calculated. The pair correlation or radial distribution function (RDF) gives the probability of finding other particles at a given distance from a given reference particle. The algorithm for calculating correlation functions is well described online on these sites:

http://www.physics.emory.edu/~weeks/idl/gofr.html
http://homepape.univie.ac.at/franz.vesely/simsp/dx/node22.html Two types of composition are considered, A atoms (A), and B atoms (B). This makes 4 combinations in total (AA, AB, BB and BA). For symmetry reasons (i.e. the sum of the relative fractions of A and B atoms is 1) only the AA and AB correlation functions are discussed. In the following, the terms reference atom type and comparison atom type will be used to denote an arbitrary combination, e.g. in AB, A is the reference type and B is the comparison type. For the two combinations considered here, a histogram is created for each that is indexed by radial distance r from a reference type particle. By taking the composition map output by the KMC simulation, each lattice site is progressed in sequence, and the sum of the compositions of all particles in a small ring between $R+\Delta R$ is calculated for a range of $R<R_{max}$, and added to the corresponding histogram and bin. Periodic boundary conditions are taken into account when necessary. When all sites have been visited, the average composition per site is evaluated for each R-bin in each histogram. Each bin must also be normalized by the average density of the comparison type atom, such that the correlation function $g(R) \to 1$ when $R \to \infty$. Finally, due to the fact that reference atoms are not strictly A or B type, g(R) must be normalized by the summed composition of all reference type atoms. An example of two correlation functions is presented in FIG. 8. There it is seen that the values of both correlation functions (simulation conditions are the same as those in FIG. 7) decrease down to a minimum before increasing again towards a steady state value at sufficiently large distances R. We define here two characteristic features of the correlation functions; the value of R at which the minimum in the correlation function occurs and the value of the correlation function at this minimum. The value R at which the minimum occurs is representative of the characteristic size of A-rich and B-rich islands (for gAA(R) and gAB(R), respectively), while the minimum value represents the typical composition spread in a typical island. Both these quantities are representative of the compositional modulation. Here we use the simulations to establish the effect of pulse train parameters on the characteristic length and thus the composition modulation Proof of Concept—Simulation Results Effect of Pulse Train Length on Compositional Modulation This section presents results on the dependency of compositional modulation (as quantified by the radial position of the minimum and the minimum value of the correlation functions) on the pulse train length for an average composition 50% at. A ($\phi_A$) and 50% at. B ($\phi_B$).

$F_P{}^A = F_P{}^B = 10^{-4}$ ML $E_D{}^A = 0.3$ eV and $E_D{}^B = 0.8$ eV $B_A = B_B = 500$ $a^4$ $s^{-1}$ $f_A = f_B = 1000$ Hz $\tau_A = \tau_B = 100$ μs $N_A = N_B$ (i.e., average composition 50% at. A and 50% at. B).

Figure 9A:
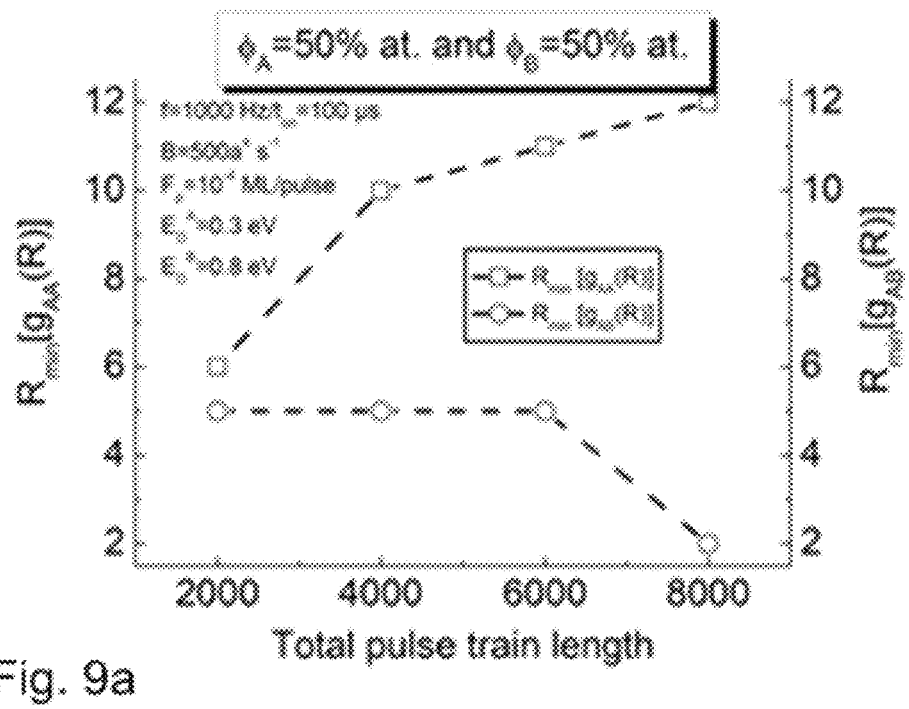
FIG. 9a illustrates radial position of first minimum of the A-A ($min[g_{AA}(R)]$) and A-B ($min[g_{AB}(R)]$) correlation functions as a function of total length of successive pulse trains ($N_A+N_B$). The simulation parameters are detailed in the text and in the figure.

In FIG. 9a, the position of the minimum of $g_{AA}(R)$ and $g_{AB}(R)$ (min[$g_{AA}(R)$] and min[$g_{AB}(R)$]) is plotted as a function of the total length of two successive pulse trains, i.e., $N_A+N_B$. These values correspond to a total coverage (i.e., total amount of material deposited) of ~1 ML. From FIG. 9a is seen for $N_A+N_B$ value of $8 \times 10^3$ min[$g_{AA}(R)$] and min[$g_{AB}(R)$] is 12 and 2, respectively (minimum expressed in multiples of the adatom translation distance a). This indicates that the characteristic size of A-rich and B-rich atoms is different, i.e., characteristic length scales (distances) for finding and atoms A and B (using atom A as reference) are different.

Figure 9B:
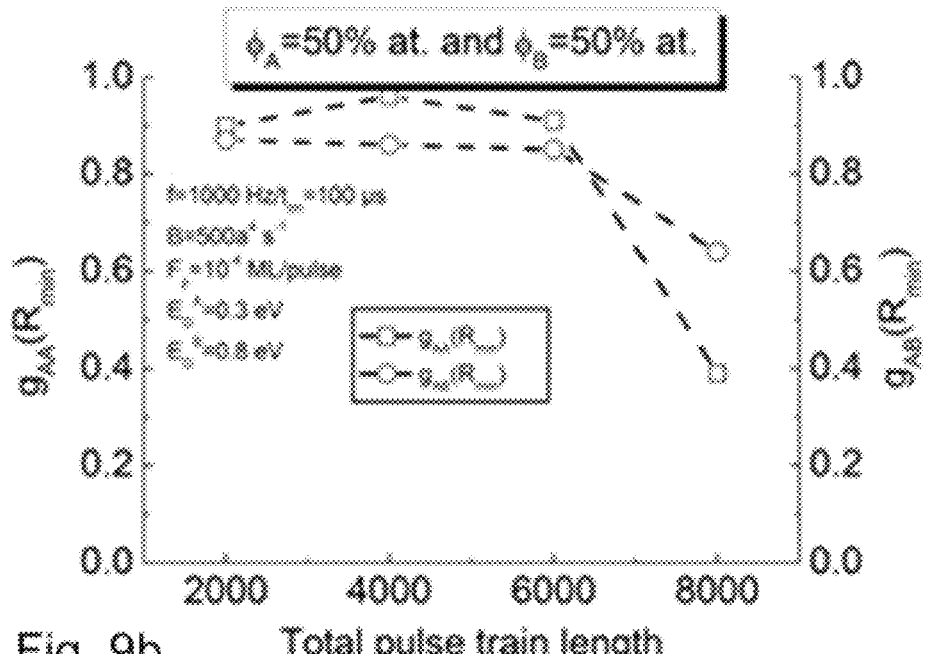
FIG. 9b illustrates minimum of correlation functions ($g_{AA}(R_{min})$ and $g_{AB}(R_{min})$). The simulation parameters are detailed in the text and in the figure. The values in figure have been extracted after simulating the deposition of ~1 ML of material (A and B atoms).

FIG. 9b presents the values $g_{AA}(R_{min})$ and $g_{AB}(R_{min})$ as a function of the total length of successive pulse trains. For $N_A+N_B$ value of $8 \times 10^3$ $g_{AA}(R_{min})$ and $g_{AB}(R_{min})$ take values of ~0.6 and ~0.4, respectively. This indicates that there is a difference in the compositional spread (i.e., deviation from the average composition) in between A-rich and B-rich atomic islands.

Both FIGS. 9a and 9b indicate that at $N_A+N_B=8 \times 10^3$ there is a compositional modulation in the film. This compositional modulation becomes less pronounced as the $N_A+N_B$ value decreases. For $N_A+N_B$ value of $2 \times 10^3$ both min[$g_{AA}(R)$] and min[$g_{AB}(R)$] (FIG. 9a) converge to a common characteristic length of ~6. At the same time $g_{AA}(R_{min})$ and $g_{AB}(R_{min})$ (FIG. 9b) at $N_A+N_B=6 \times 10^3$ saturate at a value ~1 which indicates that the composition spread in A-rich and B-rich island corresponds to the average composition.

All in all, the trends presented in FIGS. 9a and 9b indicate that by decreasing the length of the pulse trains compositional modulation disappears giving rise to a uniform composition profile that corresponds to the average fraction of atoms A and B. The corresponding min[g(R)] and $g(R_{min})$ values (both for AA and AB) for simultaneous deposition (i.e., co-deposition) are 5 and 0.86, respectively (i.e., very similar that those at relatively short pulse train lengths in FIGS. 9a-9b).

Effect of Average Composition on Compositional Modulation

Figure 10A:
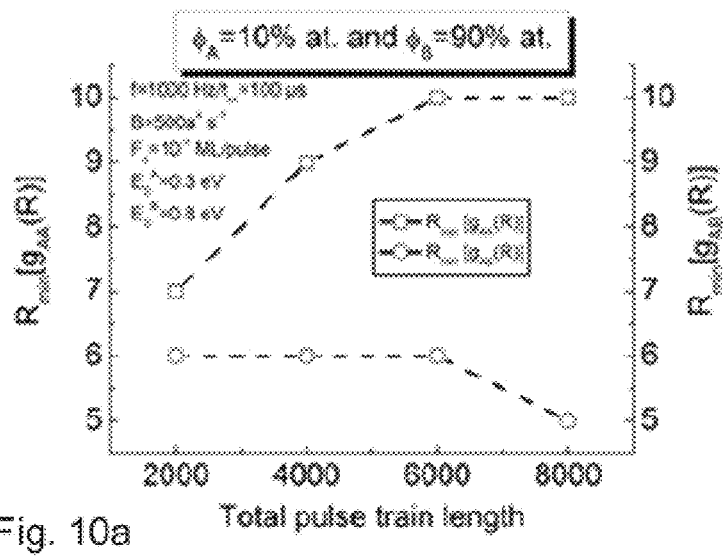
FIGS. 10a-10f present test data showing the effect of average composition on compositional modulation as defined by the position of the first minimum and the minimum values of the A-A and A-B correlation functions.
Figure 10B:
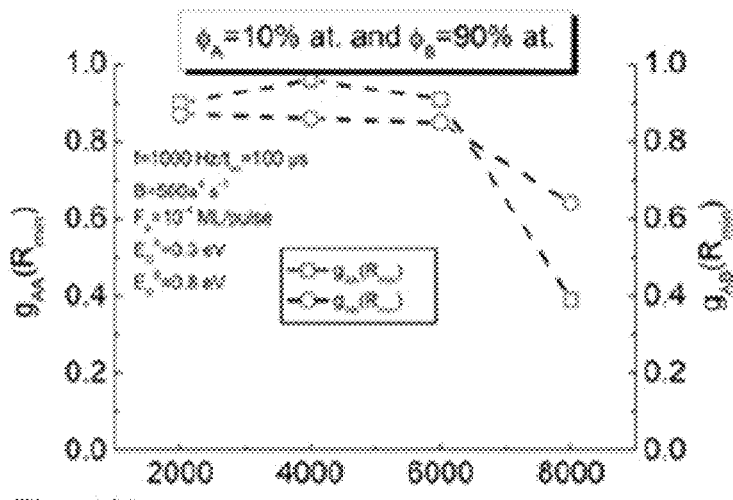
Figure 10C:
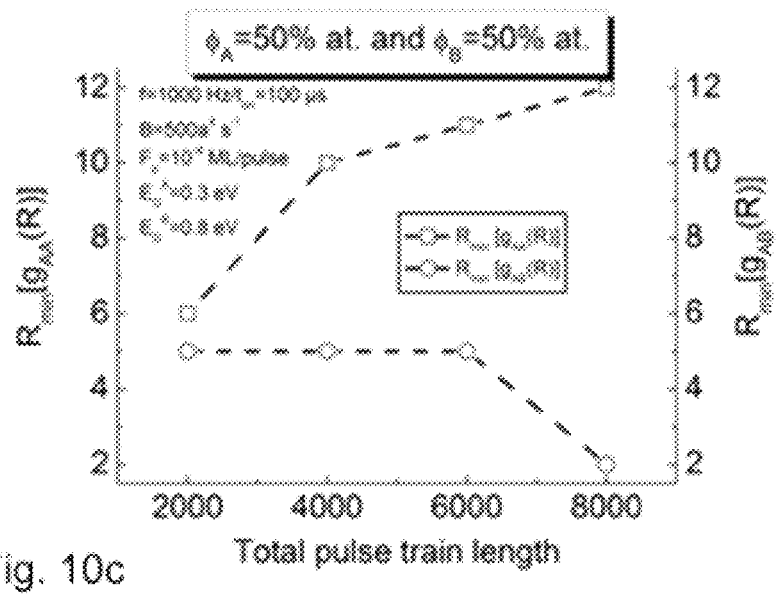
Figure 10D:
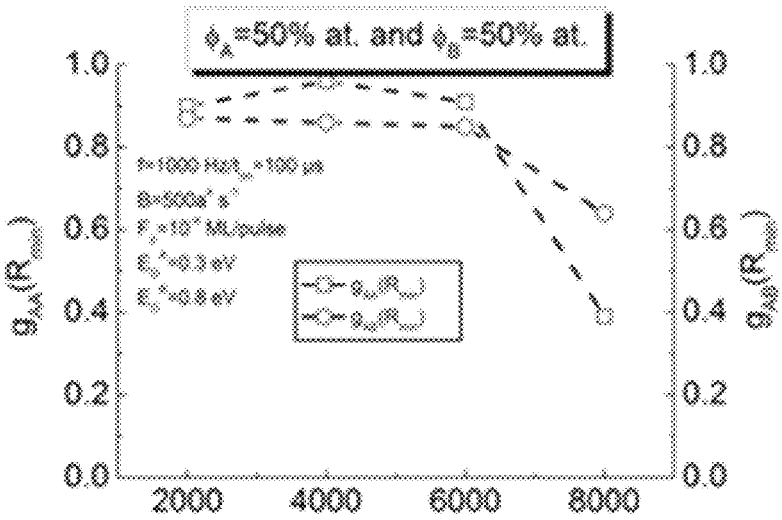
Figure 10E:
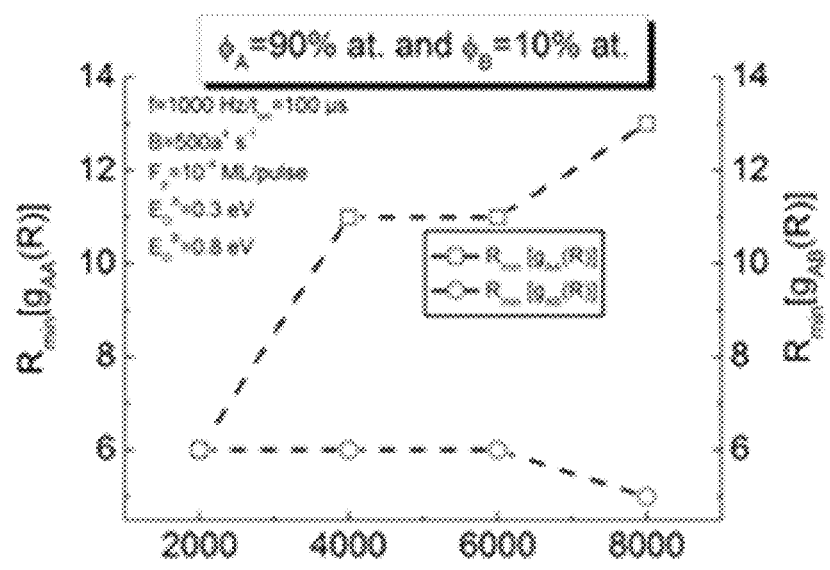
Figure 10F:
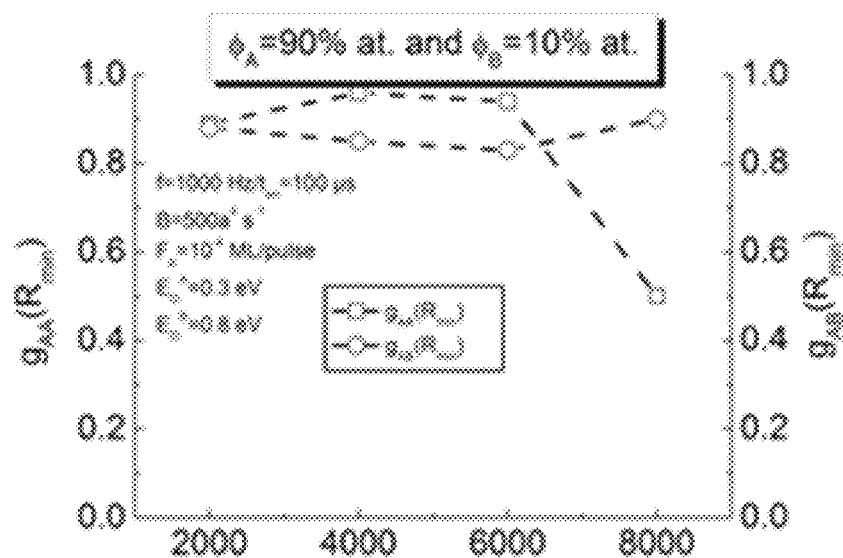

This section presents results on the dependency of compositional modulation (as quantified by the radial position of the minimum and the minimum value of the correlation functions) on the pulse train length for three average compositions, namely:

FIGS. 10a and 10b: $\phi_A=10$% at. and $\phi_B=90$% at.
FIGS. 10c and 10d: $\phi_A=50$% at. and $\phi_B=50$% at.
FIGS. 10e and 10f: $\phi_A=90$% at. and $\phi_B=10$% at.

The simulation parameters are.

$F_P{}^A = F_P{}^B = 10^{-4}$ ML $E_D{}^A = 0.3$ eV and $E_D{}^B = 0.8$ eV $B_A = B_B = 500$ $a^4$ $s^{-1}$ $f_A = f_B = 1000$ Hz $\tau_A = \tau_B = 100$ μs $N_A$ and $N_B$ are adjusted accordingly to achieve one of the three compositions listed above.

FIG. 10a illustrates the position of the minimum of $g_{AA}(R)$ and $g_{AB}(R)$ (min[$g_{AA}(R)$] and min[$g_{AB}(R)$]) for $\phi_A=10$% at as function of the total length of the pulse trains ($N_A+N_B$).

FIG. 10b illustrates the values $g_{AA}(R_{min})$ and $g_{AB}(R_{min})$ as a function of the total length of successive pulse trains for $\phi_A=10$% at.

FIG. 10c illustrates the position of the minimum of $g_{AA}(R)$ and $g_{AB}(R)$ (min[$g_{AA}(R)$] and min[$g_{AB}(R)$]) for $\phi_A=50$% at as function of the total length of the pulse trains ($N_A+N_B$).

FIG. 10d illustrates the values $g_{AA}(R_{min})$ and $g_{AB}(R_{min})$ as a function of the total length of successive pulse trains for $\phi_A=50$% at.

FIG. 10e illustrates the position of the minimum of $g_{AA}(R)$ and $g_{AB}(R)$ ($\min[g_{AA}(R)]$ and $\min[g_{AB}(R)]$) for $\phi_A$=90% at as function of the total length of the pulse trains ($N_A+N_B$).

FIG. 10f illustrates the values $g_{AA}(R_{min})$ and $g_{AB}(R_{min})$ as a function of the total length of successive pulse trains for $\phi_A$=90% at.

Data are taken at a coverage of ~1 ML. Despite the quantitative differences, FIGS. 10a-10f (similarly to FIGS. 9a-9b) show that a decrease of the total pulse train length leads from a film with a pronounced compositional modulation to a film with a uniform composition defined by the average composition value.

Effect of Pulsing Frequency on Compositional Modulation

Figure 11A:
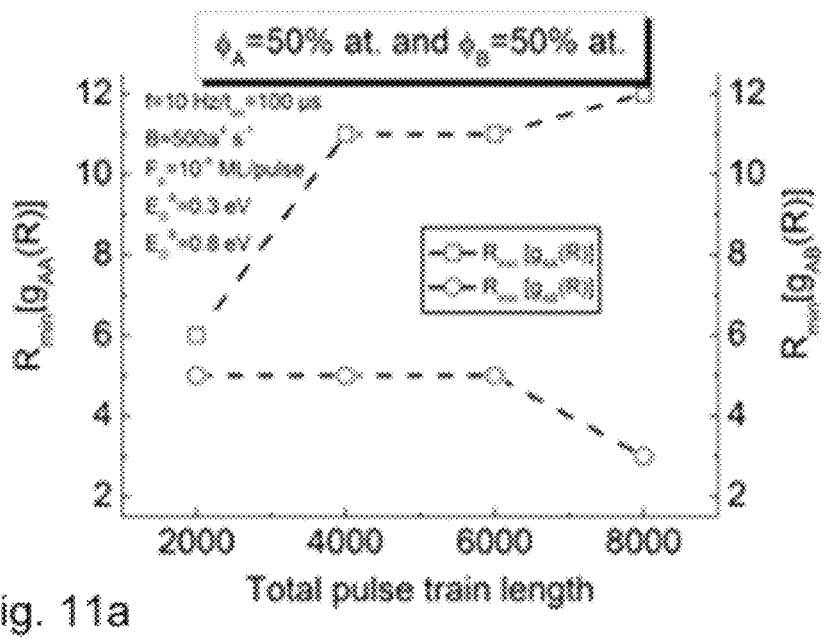
FIGS. 11a-11f present test data showing the effect of pulsing frequency on compositional modulation as defined by the position of the first minimum and the minimum values of the A-A and A-B correlation functions.
Figure 11B:
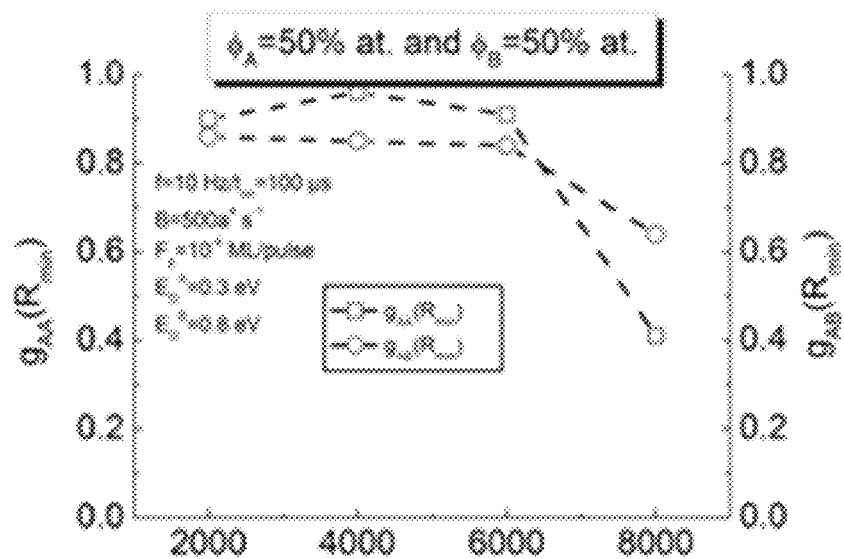

This section presents results on the dependency of compositional modulation (as quantified by the radial position of the minimum and the minimum value of the correlation functions) on the pulse train length for three pulsing frequencies:

FIGS. 11a and 11b: $f_A=f_B$=10 Hz
FIGS. 11c and 11d: $f_A=f_B$=100 Hz
FIGS. 11e and 11f: $f_A=f_B$=1000 Hz The simulation parameters are.

$F_P^A=F_P^B=10^{-4}$ ML $E_D^A$=0.3 eV and $E_D^B$=0.8 eV $B_A=B_B$=500 a$^4$ s$^{-1}$ $\tau_A=\tau_B$=100 µs $N_A=N_B$ (i.e., average composition 50% at. A and 50% at. B).

Figure 11C:
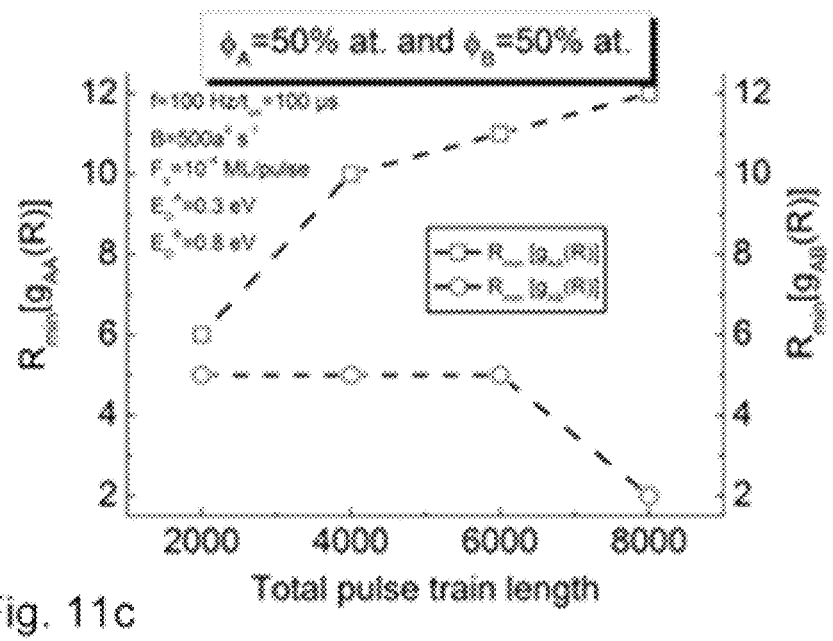
Figure 11D:
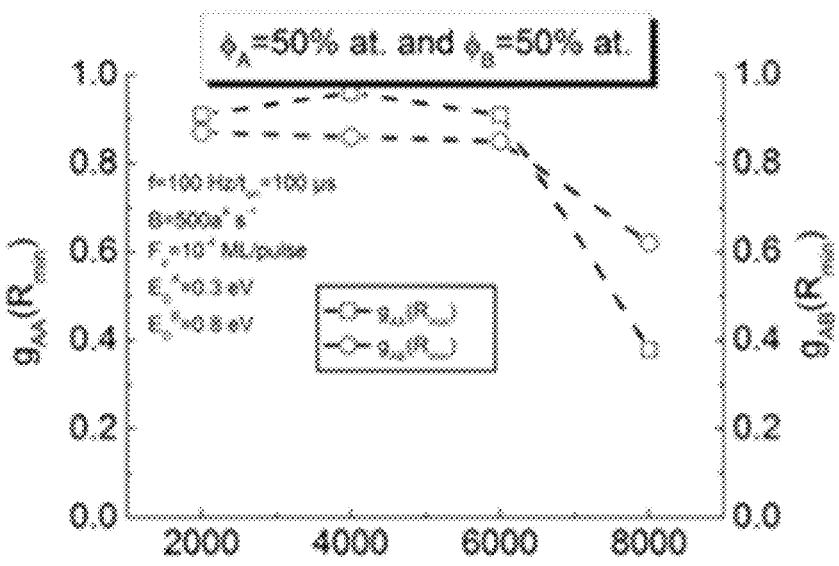
Figure 11E:
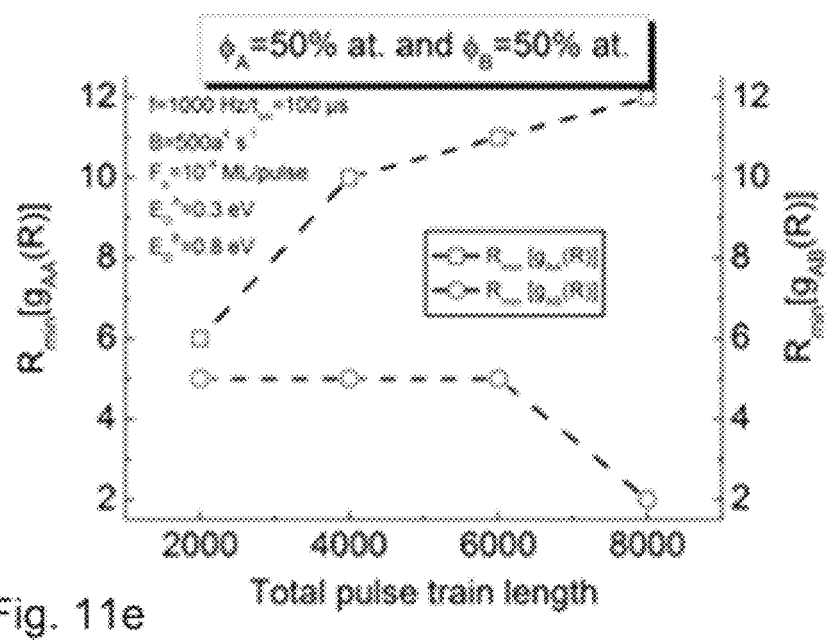

FIGS. 11a, 11c and 11e illustrate radial position of first minimum of the A–A ($\min[g_{AA}(R)]$) and A–B ($\min[g_{AB}(R)]$) correlation functions as a function of total length of successive pulse trains ($N_A+N_B$) at $f_A=f_B$=10, 100 and 1000 Hz, respectively.

Figure 11F:
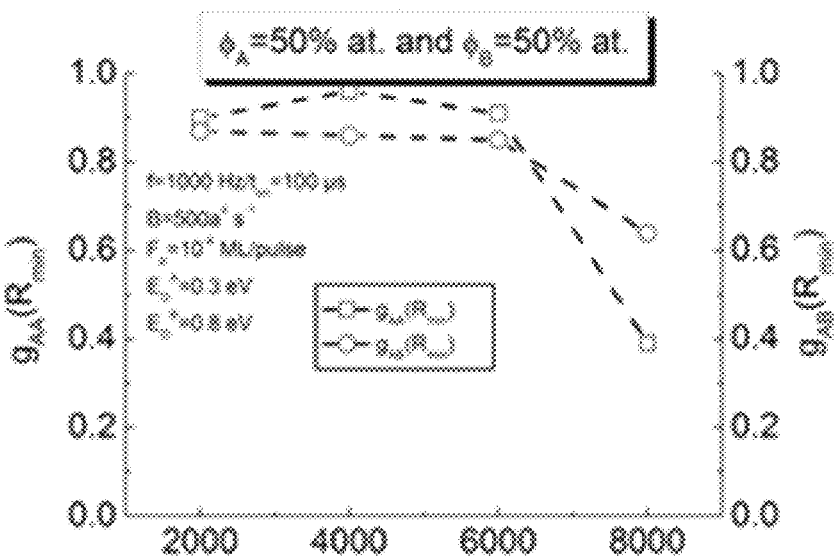

FIGS. 11b, 11d and 11f illustrate Minimum of correlation functions ($g_{AA}(R_{min})$ and $g_{AB}(R_{min})$) at $f_A=f_B$=10, 100 and 1000 Hz, respectively.

The simulation parameters are detailed in the text. The values in figure have been extracted after simulating the deposition of ~1 ML of material (A and B atoms).

The data exhibit very small quantitative differences for the various pulsing frequencies, and similarly to FIGS. 9 and 10 show that a decrease of the total pulse train length leads from a film with a pronounced compositional modulation to a film with a uniform composition defined by the average composition value.

Effect of Coalescence Speed on Composition Modulation

Figure 12A:
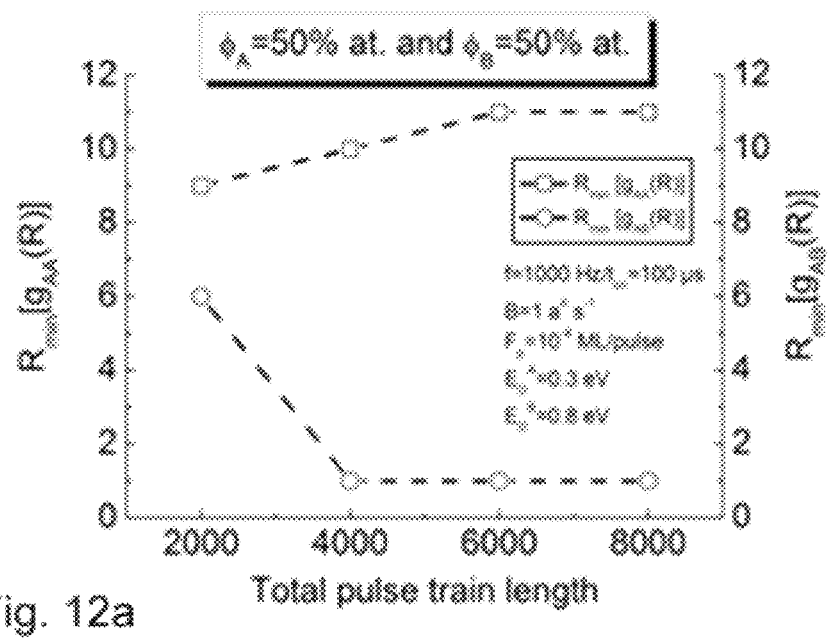
FIGS. 12a-12f present test data showing the effect of coalescence speed on composition modulation as defined by the position of the first minimum and the minimum values of the A-A and A-B correlation functions.
Figure 12B:
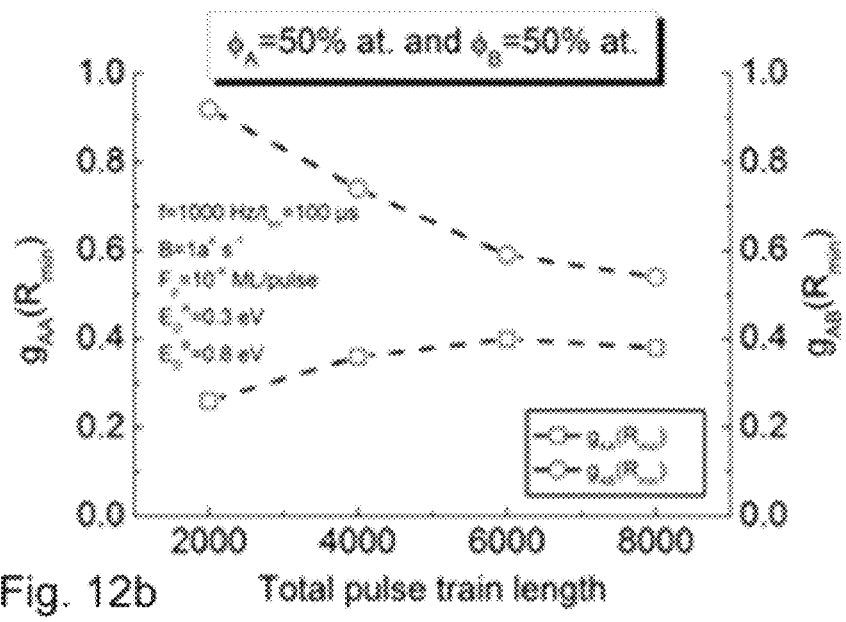
Figure 12C:
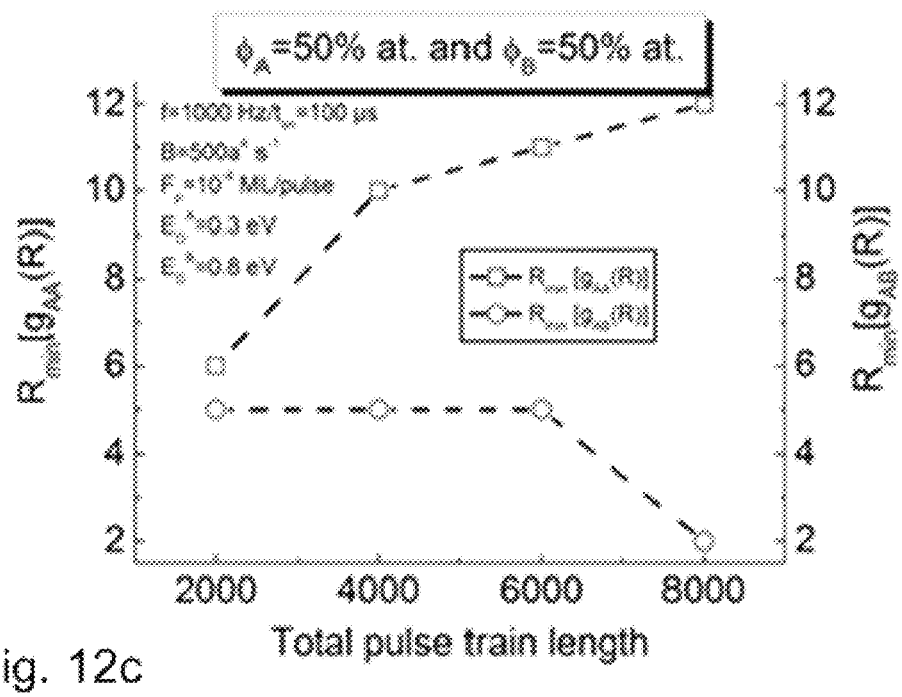
Figure 12D:
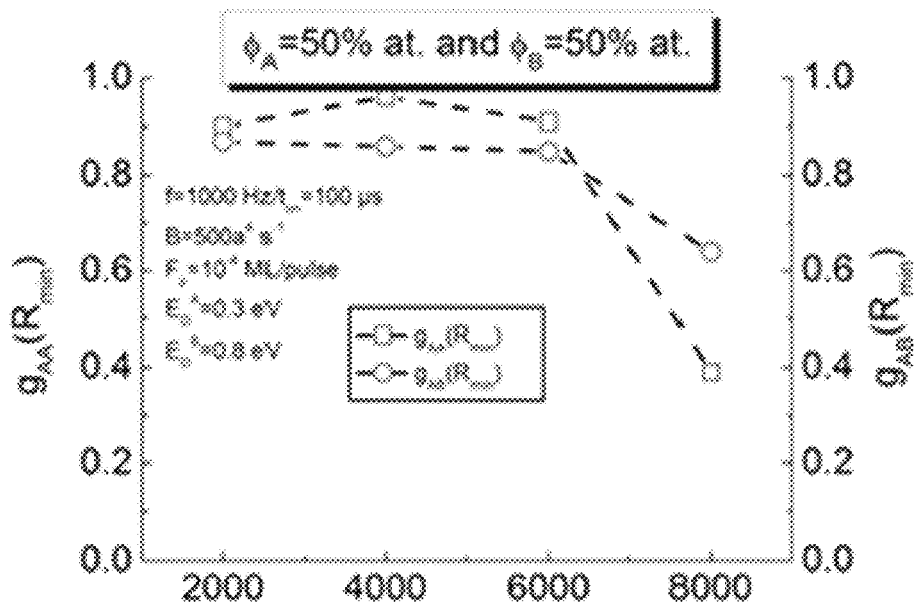
Figure 12E:
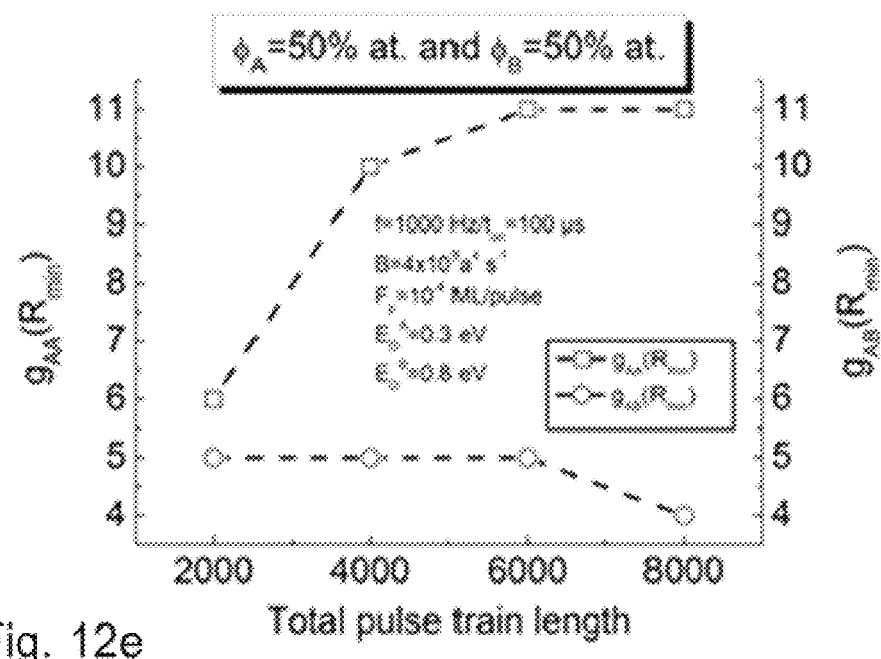
Figure 12F:
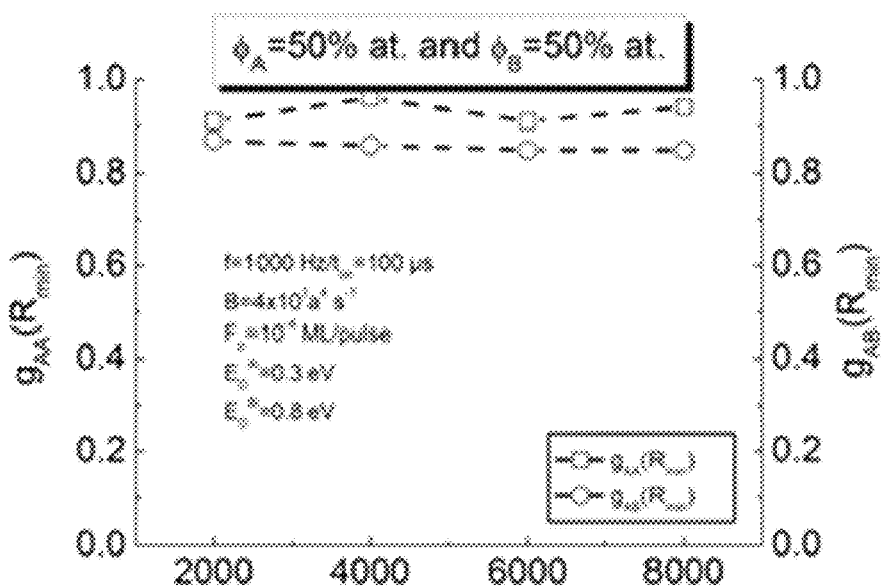

This section presents results on the dependency of compositional modulation (as quantified by the radial position of the minimum and the minimum value of the correlation functions) on the coalescence speed as quantified by the values of the coalescence parameter B. Three different B values were simulated namely:

FIGS. 12a and 12b $B_A=B_B$=1 a$^4$ s$^{-1}$
FIGS. 12c and 12d $B_A=B_B$=500 a$^4$ s$^{-1}$
FIGS. 12e and 12f $B_A=B_B$=4×10$^3$ a$^4$ s$^{-1}$ The simulation parameters are.

$F_P^A=F_P^B=10^{-4}$ ML $E_D^A$=0.3 eV and $E_D^B$=0.8 eV $f_A=f_B$=1000 Hz $\tau_A=\tau_B$=100 µs $N_A=N_B$ (i.e., average composition 50% at. A and 50% at. B).

FIGS. 12a, 12c, 12e present position of first minimum of the A-A ($\min[g_{AA}(R)]$) and A-B ($\min[g_{AB}(R)]$) correlation functions as a function of total length of successive pulse trains ($N_A+N_B$).

FIGS. 12b, 12d, 12f present minimum of correlation functions ($g_{AA}(R_{min})$ and $g_{AB}(R_{min})$). The simulation parameters are detailed in the text.

Data are taken at a coverage of ~1 ML with the exception of $B_A=B_B$=1 a$^4$ for which data are taken below 1 ML because elongation transition thickness is reached for coverages below 1 ML.

On a qualitative level, FIGS. 12a-12f show the same trend as FIGS. 9a-9b, 10a-10f and 11a-11f, i.e., a decrease of the total pulse train length leads from a film with a pronounced compositional modulation to a film with a uniform composition defined by the average composition value. However, the compositional modulation becomes less pronounced when B value is increased since completion of coalescence favors intermixing between atomic islands.

Effect of deposition rate per pulse on compositional modulation

Figure 13A:
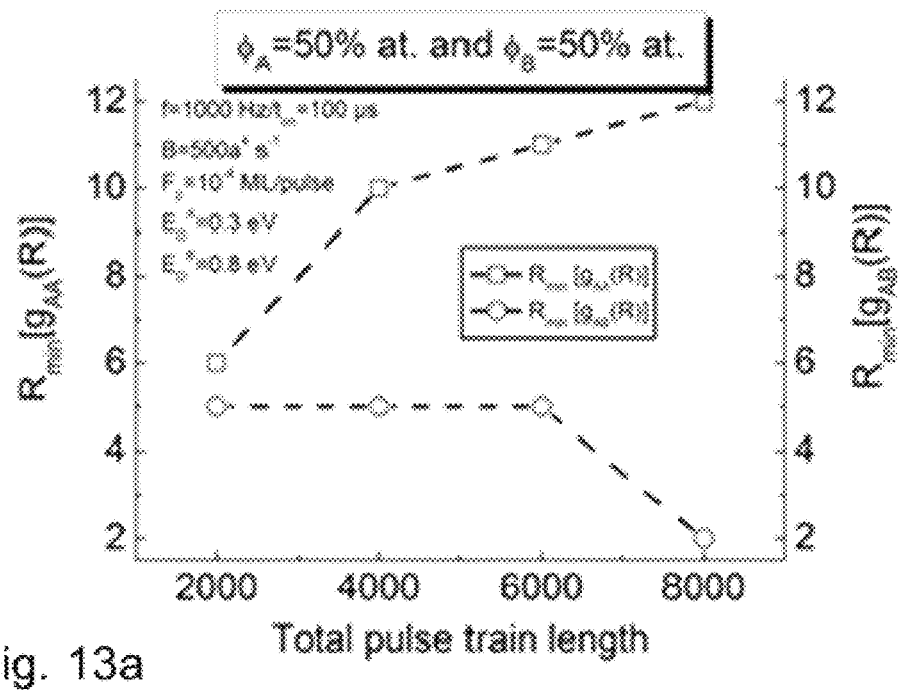
FIGS. 13a-13d present test data showing the Effect of deposition rate per pulse on compositional modulation as defined by the position of the first minimum and the minimum values of the A-A and A-B correlation functions.
Figure 13B:
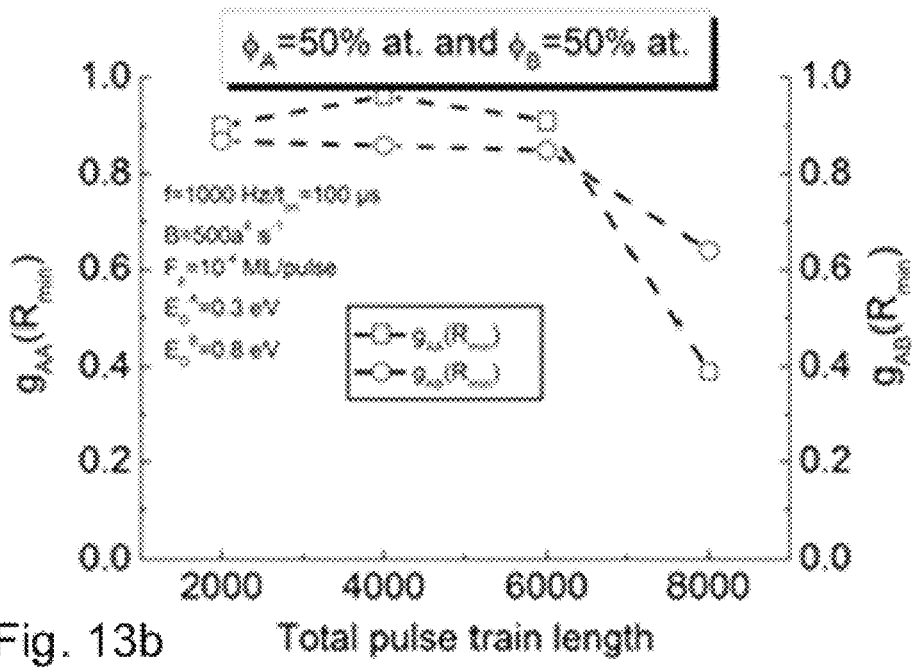

This section presents results on the dependency of compositional modulation (as quantified by the radial position of the minimum and the minimum value of the correlation functions) on the deposition rate per pulse, $F_P$. Two different $F_P$ values were simulated namely:

FIGS. 13a and 13b: $F_P$=10$^{-4}$ MLs$^{-1}$
FIGS. 13c and 13d: $F_P$=10$^{-2}$ MLs$^{-1}$ The simulation parameters are.

$B_A=B_B$=500 a$^4$ s$^{-1}$ $E_D^A$=0.3 eV and $E_D^B$=0.8 eV $f_A=f_B$=1000 Hz $\tau_A=\tau_B$=100 µs $N_A=N_B$ (i.e., average composition 50% at. A and 50% at. B).

Figure 13C:
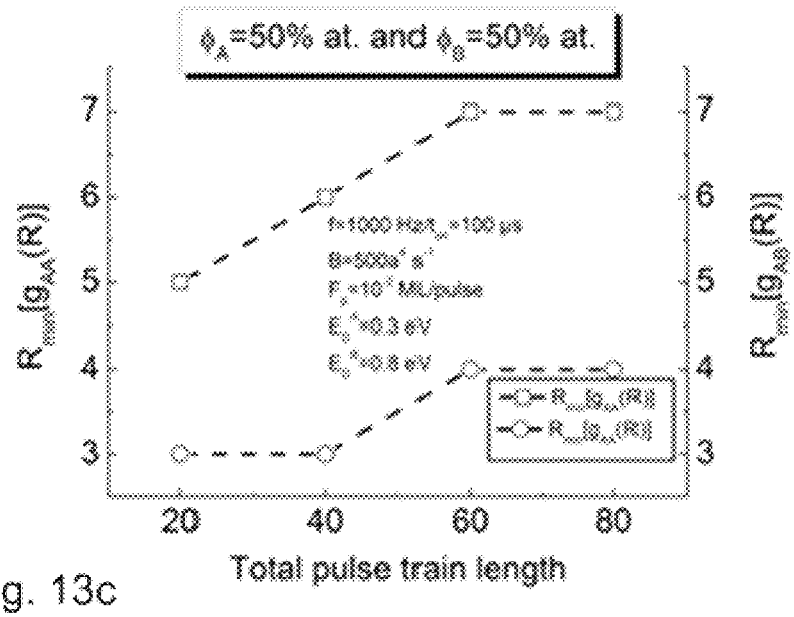

In FIGS. 13a and 13c, the position of the minimum of $g_{AA}(R)$ and $g_{AB}(R)$ ($\min[g_{AA}(R)]$ and $\min[g_{AB}(R)]$) for $F_P$=10$^{-4}$ and 10$^{-2}$ MLs$^{-1}$, respectively, is presented as function of the total length of the pulse trains ($N_A+N_B$).

Figure 13D:
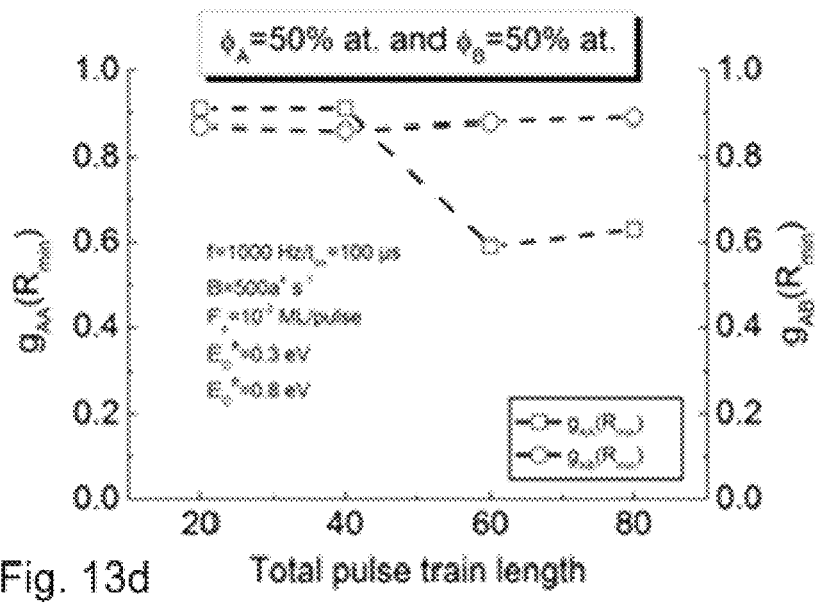

FIGS. 13b and 13d present the values $g_{AA}(R_{min})$ and $g_{AB}(R_{min})$ as a function of the total length of successive pulse trains for $F_P$=10$^{-4}$ and 10$^{-2}$ MLs$^{-1}$, respectively. Data are taken at a coverage of ~1 ML.

On a qualitative level the figure shows the same trend as FIGS. 9a-9b, 10a-10f, 11a-11f and 12a-12f, i.e., a decrease of the total pulse train length leads from a film with a pronounced compositional modulation to a film with a uniform composition defined by the average composition value.

Effect of Growth Mode on Compositional Modulation

This section presents results on the dependency of compositional modulation (as quantified by the radial position of the minimum and the minimum value of the correlation functions) on the growth mode.

Two types of growth were simulated, namely three-dimensional (3-D) and two-dimensional (2-D) growth.

The 3-D is for instance encountered during polycrystalline growth of films on substrates with surface energies much smaller than that of the deposit (e.g., metals on insulators). It is also possible in epitaxial growth when kinetic conditions lead to limited interlayer (i.e., between atomic layers on an atomic island) diffusion.

The 2-D growth is encountered in epitaxy experiments when kinetic conditions favour interlayer diffusion of adatoms leading to growth of atomic islands in the in-plane direction (i.e., on the plane of the substrate). 2-D type growth can also be encountered in polycrystalline film growth when kinetic conditions favour high nucleation density. The simulation parameters are:

$F_P = 10^{-4}$ MLs$^{-1}$ $B_A = B_B = 500$ a$^4$ s$^{-1}$ $E_D^A = 0.3$ eV and $E_D^B = 0.8$ eV $f_A = f_B = 1000$ Hz $\tau_A = \tau_B = 100$ μs $N_A = N_B$ (i.e., average composition 50% at. A and 50% at. B).

Figure 14A:
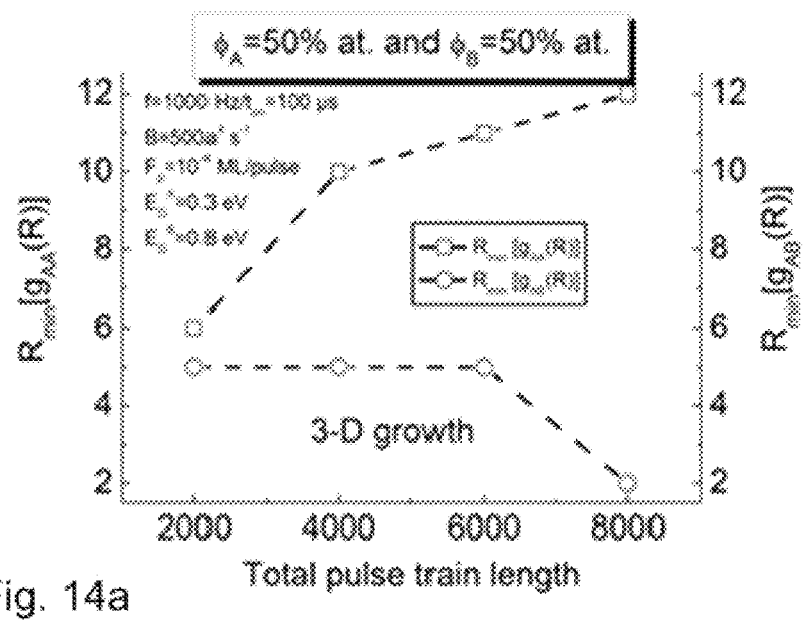
FIGS. 14a-14d present test data showing the Effect of growth mode on compositional modulation as defined by the position of the first minimum and the minimum values of the A-A and A-B correlation functions.
Figure 14B:
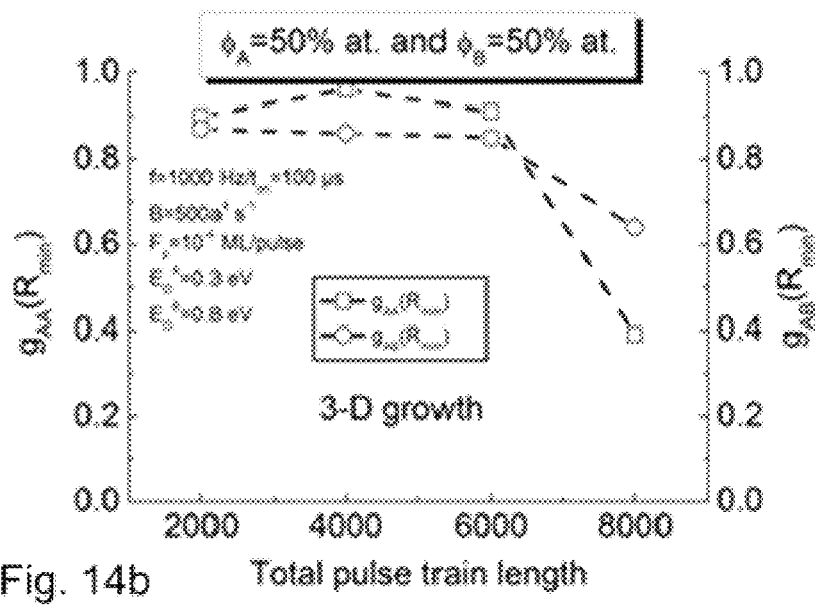
Figure 14C:
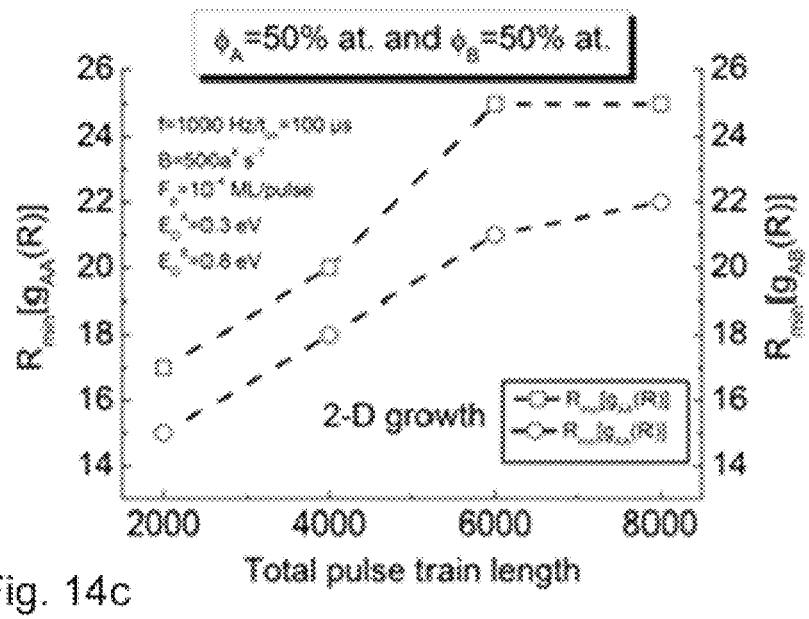

In FIGS. 14a and 14c, the position of the minimum of $g_{AA}(R)$ and $g_{AB}(R)$ (min[$g_{AA}(R)$] and min[$g_{AB}(R)$]) for 3-D and 2-D growth (FIGS. 14a and 14c, respectively) is presented as function of the total length of the pulse trains ($N_A + N_B$).

Figure 14D:
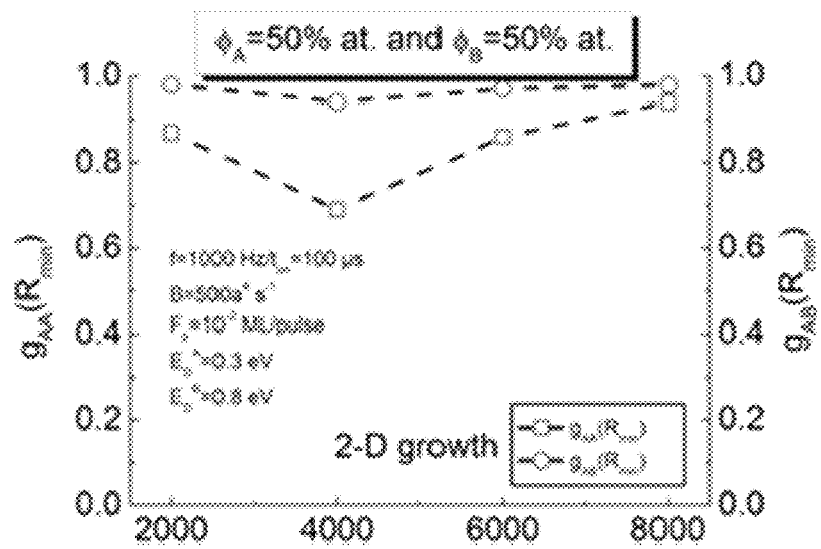

FIGS. 14b and 14d present the values $g_{AA}(R_{min})$ and $g_{AB}(R_{min})$ as a function of the total length of successive pulse trains for 2-D and 3-D growth (FIGS. 14b and 14d, respectively). Data are taken at a coverage of ~1 ML and ~0.6 ML for 3-D and 2-D growth, respectively. On a qualitative level the figure shows the same trend as FIGS. 9a-9b, 10a-10f, 11a-11f, 12a-12f and 13a-13d, i.e., a decrease of the total pulse train length leads from a film with a pronounced compositional modulation to a film with a uniform composition defined by the average composition value.

However, the trends for 2-D deposition are less pronounced. In addition, the characteristic sizes of A-rich and B-rich islands for 2-D growth (as quantified by min[$g_{AA}(R)$] and min[$g_{AB}(R)$], respectively is much larger than that of 3-D growth.

This can be explained by the fact that addition of material in 2-D results in growth of island in the plane of the substrate, i.e., for the same amount of deposited material the area covered by island is much larger than that in 3-D growth.

The latter has also as consequence a larger probability for condensing atoms to be captured by existing islands which increases intermixing as seen by relatively large values of $g_{AA}(R_{min})$ and $g_{AB}(R_{min})$ in FIGS. 14a-14d.

Proof of Concept—Experimental Data

The invention was tested in practice using AlN—Ag films as model system.

Ag grows on AlN in a 3-dimensional fashion, while AlN grows on Ag and on itself in a 2-dimensional fashion. Thus, qualitative comparison with KMC simulations that describe both 2-dimensional and 3-dimensional growth is possible. At the same time Ag and AlN are completely immiscible [Siozos et al., Nano Letters 12 (2012) 259]. This fact expands the area of relevance of the invention, since KMC simulations treated fully miscible systems. In general, combination of KMC simulations and experimental data for the AlN—Ag system provide data for all possible scenarios that can be encountered during growth of multicomponent systems.

Based on the very different melting point of the two materials (1230 and 3200 K for Ag and AlN respectively) we can expect that diffusivity of Ag will be much larger than that of AlN related species (Ts/Tm assuming room temperature is 0.24 and 0.1 for Ag and AlN respectively). Moreover, the coalescence parameter B is reported for Ag to be in the range between 500 and 2000 cm$^4$s$^{-1}$. Coalescence is a surface driven process. Thus, owing the much larger self-diffusion barriers of Al and N on AlN we can expect B for AlN to be considerably smaller.

AlN—Ag films were grown in an ultra-high vacuum chamber with a base pressure better than 10$^{-8}$ Pa. The chamber was equipped with a number of magnetron cathodes. On two of the cathodes Al and Ag sputtering target with a diameter of 76.2 mm and thickness of 6 mm were mounted. The cathode-to-substrate separation was 125 mm and 75 mm, for the Ag and Al cathode, respectively. Sputtering experimental were carried out at a working pressure of 0.67 Pa which was achieved by introducing 45 sccm (standard cubic centimeters) of Ar and 4.6 sccm of N$_2$ in the vacuum chamber and throttling the turbomolecular pump in a pre-defined way. The presence of 4.6 sccm N$_2$ in the gas atmosphere facilitated growth of stoichiometry AlN while Ag, not being reactive with respect to N$_2$, was not affected (in terms of chemical composition) by the presence of N$_2$. The substrate was not heated intentionally during deposition. However, slight increase of the temperature due to heating by the plasma cannot be excluded. Pulse trains were generated by two High Power Impulse Magnetron Sputtering (HiPIMS) power generators coupled with each other via a synchronization device (similar to arbitrary wave function generator). The powering conditions for each cathode were:

Average power($P_T$): $P_T^{Ag} = 1$ W, $P_T^{Al} = 265$ W

Pulsing frequency: $f^{Ag} = 100$ Hz, $f^{Al} = 1000$ Hz

Pulse width: $\tau^{Ag} = 50$ μs, $\tau^{Al} = 50$ μs

Due to scattering of sputtered species in the gas phase en route to the substrate the actual pulse width is estimated to be ~100 μs [Magnfält et al., J. Phys. D: Appl. Phys. 46 (2013) 215303]. These power conditions resulted in the following deposition rates per pulse (calculated by measuring the thickness of reference AlN and Ag films):

$F_P^{Ag} = 2.2 \times 10^{-3}$ Å/pulse $F_P^{AlN} = 5.3 \times 10^{-4}$ Å/pulse By taking in to account that the most common crystallographic texture for Ag and AlN is (111) and (0002), respectively the above given rate values can be expressed in MLs$^{-1}$, i.e., $F_P^{Ag} \sim 10^{-3}$ MLs$^{-1}$ $F_P^{AlN} \sim 10^{-4}$ MLs$^{-1}$ AlN—Ag films were grown for different combinations of pulse train lengths applied on the Ag and Al cathode ($N^{Ag}$ and $N^{Al}$, respectively). To demonstrate the effect of pulse train length on the compositional modulation in a single sample a multilayer stack in which AlN—Ag layers with different combinations of $N^{Ag}$ and $N^{Al}$ values was deposited. The architecture of this multilayer stack is depicted in FIG. 15.

Figure 16:
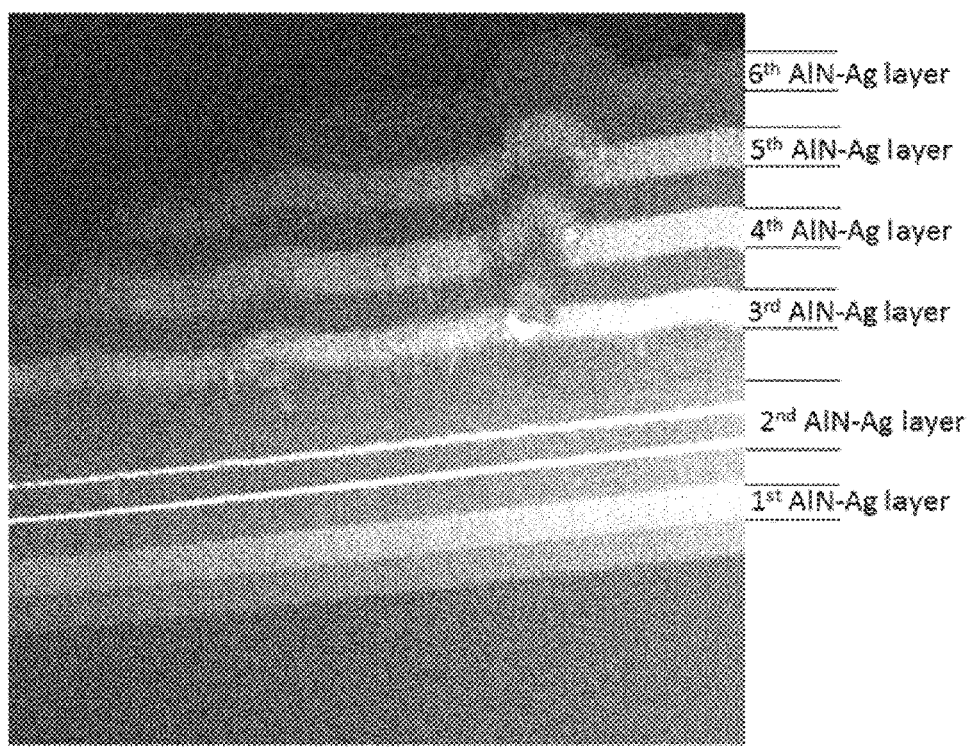
FIG. 16 provides an HAADF-STEM overview of the AlN—Ag multilayer stack.

FIG. 16 illustrates the architecture of a multilayer stack used to demonstrate the effect of pulse train length on composition modulation. Each AlN—Ag layer is separated by a 500 Å thick AlN buffer layer grown at identical, each time, conditions. Note that the first and last AlN—Ag layers are grown at identical conditions for reference purposes. The intended nominal thickness of each AlN—Ag layer is 800 Å.

The compositional modulation was analyzed by means of high-angle annular dark field (HAADF) scanning transmission electron microscopy (STEM). Cross-section specimens were prepared using a state-of-the-art procedure. HAADF-STEM images exhibit intensity contrast based on the difference in the atomic number of the element that is probed (Z-contrast), i.e., heavy elements exhibit higher intensity. In the case of the multilayer stack Ag-rich areas appear brighter than Al-rich areas as seen in the overview of the multilayer stack shown in FIG. 16.

FIG. 16 provides an HAADF-STEM overview of the AlN—Ag multilayer stack. Bright layers correspond to Ag-rich areas while darker to Al-rich areas. The AlN buffer layers are also clearly visible. The growth conditions of each AlN—Ag layer (in terms of pulse train lengths on Ag and Al cathodes) are provided in FIG. 15.

HAADF-STEM images of the $1^{st}$, $2^{nd}$ and $4^{th}$ layer are shown in 17a, 17b and 17c, respectively.

Figure 17A:
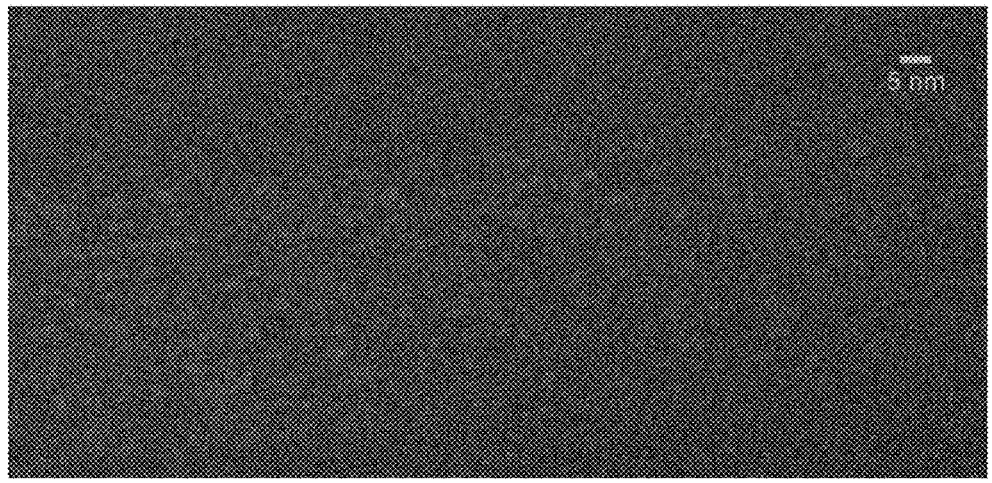
FIGS. 17a-17c provide HAADF-STEM images of layer 1, 2 and 4 (cf.

In FIG. 17a (corresponding to the $1^{st}$ layer of the stack) out of plane and in plane periodic (or quasi periodic) intensity variations are observed. This indicates an out of plane but more importantly an in plane compositional modulation which exhibits a large degree of periodicity.

Figure 17B:
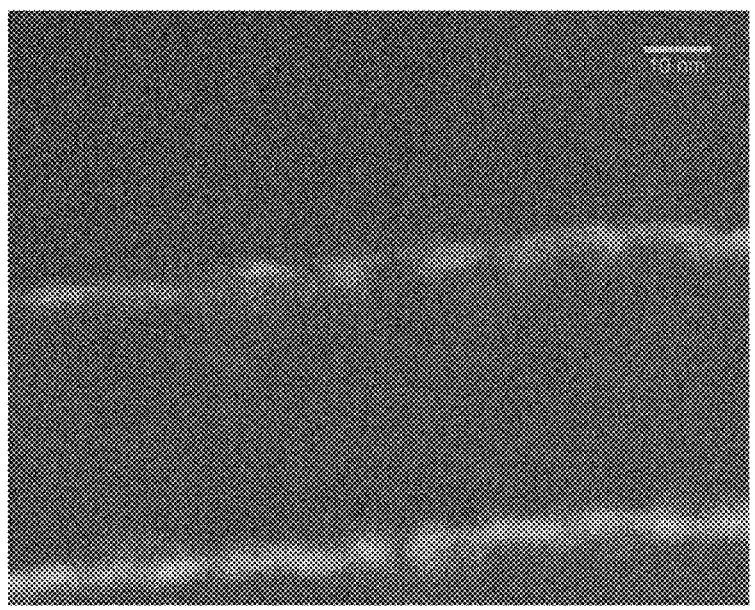

In FIG. 17b (corresponding to the $2^{nd}$ layer of the stack) mainly out of plane intensity variation is seen with two Ag-rich layers (bright layers) separated by a ~30 nm thick AlN layer.

Figure 17C:
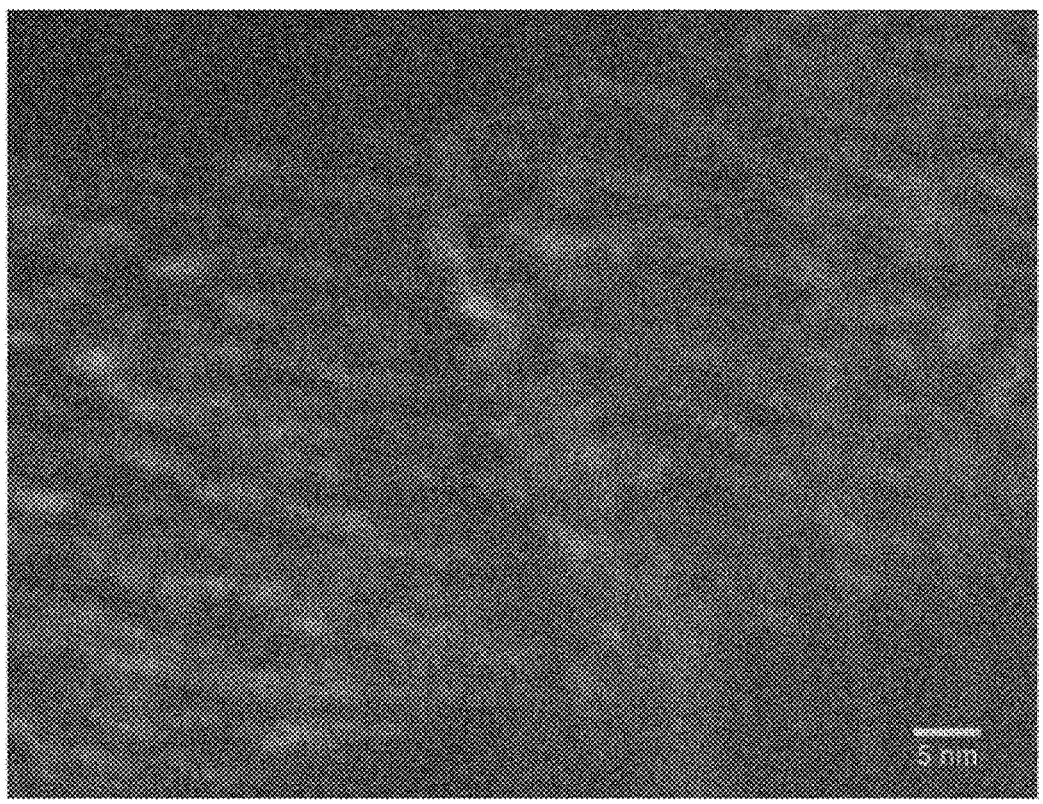

In FIG. 17c (corresponding to the $4^{th}$ layer of the stack) intensity (i.e., compositional) modulation is less pronounced and more irregular, but mainly in the out-of-plane direction.

Figure 18A:
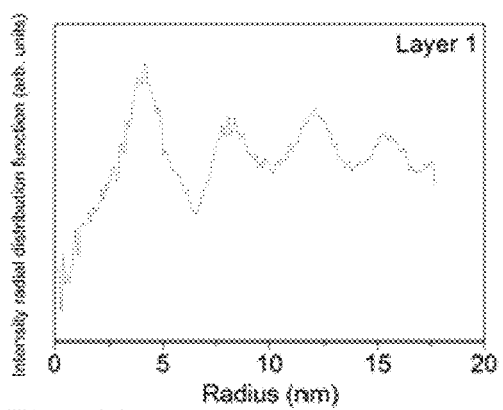
FIGS. 18a-18c provide the intensity radial distribution functions of the HAADF-STEM images in FIGS. 17a-17c.
Figure 18B:
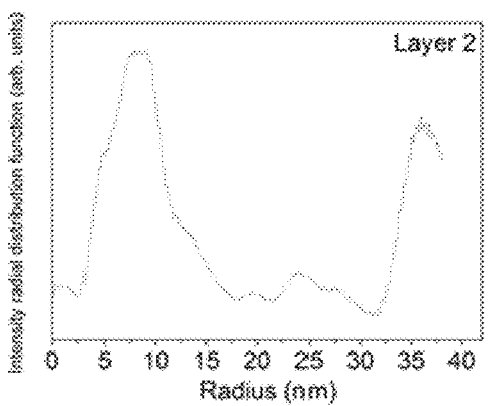
Figure 18C:
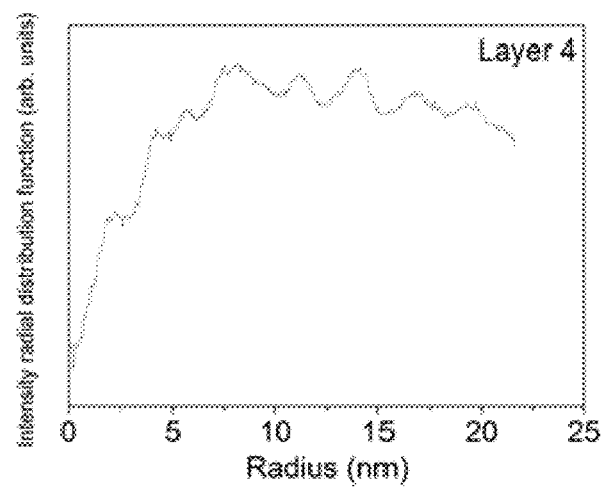

For each of FIGS. 17a, 17b and 17c, the intensity-intensity correlation function (procedure described in KMC document) was calculated and displayed in FIGS. 18a, 18b and 18c. Since intensity contrast in the HAADF images depends on mass contrast, the intensity-intensity correlation functions in FIGS. 18a-18c entail information about the compositional modulation. The distance between intensity-maxima is representative of the characteristic length of the compositional modulation.

In FIG. 18a (corresponding to the first layer of the stack) large intensity maxima with distances of the order of 4 nm are observed. These maxima emanate from the out-of-plane compositional modulation. Concurrently an intensity modulation with a wavelength of the order of 0.5 nm is superimposed on the previous intensity modulation. The short wavelength modulation emanates from the in plane compositional modulation.

In FIG. 18b (corresponding to the 2nd layer of the stack) two strong intensity maxima with a distance of ~30 nm are observed that correspond to the out of plane compositional modulation. Less pronounced intensity oscillations with characteristic separation in the order of 5 nm are seen. These correspond to intensity/compositional modulations in the Ag-rich layers.

In FIG. 18c less pronounced (with respect to the other Figures) variation of the intensity is observed with typical wavelength of ~4 nm corresponding to the weak out-of-plane compositional modulation.

The data presented in FIGS. 17a-17c and 18a-18c show that by changing the process parameters (i.e., length of the pulse train) out of plane but more importantly in plane modulation of the composition can be achieved.

The invention claimed is:

1. A method of coating a substrate so as to provide a controlled in-plane compositional modulation, comprising: providing a first target of a first material or material composition,
providing a second target of a second material or material composition, different from the first material or material composition;
activating the first and second targets to release particles by evaporation, sublimation or sputtering; and
causing the released particles to impinge onto the substrate such that the substrate is coated; and
wherein activation of one of the targets includes providing a series of activation pulses, such that pulsed evaporation, sublimation or sputtering of particles is provided, while the other one of the targets is substantially passive;
wherein the first and second target materials or material compositions present:
a respective homologous temperature, defined as a ratio of the substrate temperature to the target material or material composition melting temperature of the target material or material composition having the lowest melting temperature,
a miscibility as defined by a mixing enthalpy of the target materials or material compositions,
wherein the mixing enthalpy of the materials or material compositions greater than zero is defined as immiscible and a mixing enthalpy of the materials or material compositions less than zero is defined as miscible;
wherein the target materials or material compositions present two-dimensional growth,
wherein the homologous temperature is greater than 0.1 and less than 0.4;
wherein the amount of material deposited per pulse train from each target material or material composition is greater than 0.1 monolayer and less than 2 monolayers, and
wherein the target materials or material compositions are immiscible.

2. The method as claimed in claim 1, wherein (i) a difference in surface energy between the first and second materials or material compositions is less than 50%, or (ii) if the difference in surface energy is greater, then the material or material composition having lower surface energy is grown on the material or material composition having higher surface energy.

3. The method as claimed in claim 1, wherein activation of the first target is achieved by a first activation pulse train consisting of a first number of activation pulses and wherein activation of the second target is achieved by a second activation pulse train consisting of a second number of activation pulses.

4. The method as claimed in claim 3, wherein the first number of activation pulses is different from the second number of activation pulses.

5. The method as claimed in claim 1, further comprising:
providing a third target of a third material or material composition, different from the first material or material composition and different from the second material or material composition;
activating the third target to provide a pulsed evaporation, or sublimation or sputtering of particles; and
causing the released particles to impinge onto the substrate such that the substrate is coated;
wherein activation of the third target includes providing a series of activation pulses while at least one of the first and second targets is substantially passive.

6. The method as claimed in claim 1, wherein activating the first and second targets, and third target, if any, comprises supplying electrical power to the respective target.

7. The method as claimed in claim 1, wherein said sputtering is produced by a magnetron sputtering process.

8. The method as claimed in claim 1, wherein said first and second targets are arranged on cathodes for cathode arc activating.

9. The method as claimed in claim 1, wherein said first and second targets are activated by laser activation.

10. The method as claimed in claim 1, wherein the deposited material is a ternary nitride with the general formula MeAlN, where Me is a transition metal selected from the group consisting of Ti, V, Cr, Zr, Nb, Mo, Hf, Ta, and W.

11. A method of coating a substrate so as to provide a controlled in-plane compositional modulation, comprising:
providing a first target of a first material or material composition;
providing a second target of a second material or material composition, different from the first material or material composition;
activating the first and second targets to release particles by evaporation, sublimation or sputtering; and
causing the released particles to impinge onto the substrate such that the substrate is coated; and
wherein activation of one of the targets includes providing a series of activation pulses, such that pulsed evaporation, sublimation or sputtering of particles is provided, while the other one of the targets is substantially passive;
wherein the first and second target materials or material compositions present:
a respective homologous temperature, defined as a ratio of the substrate temperature to the target material or material composition melting temperature of the target material or material composition having the lowest melting temperature,
a miscibility, as defined by a mixing enthalpy of the target materials or material compositions,
wherein the mixing enthalpy of the materials or material compositions greater than zero is defined as immiscible and a mixing enthalpy of the materials or material compositions less than zero is defined as miscible,
wherein the target materials or material compositions present two-dimensional growth,
wherein the homologous temperature is greater than 0.1 and less than 0.4;
wherein the amount of material deposited per pulse train from each target material or material composition is greater than 0.1 monolayer and less than 2 monolayers, and
wherein the target materials or material compositions are miscible.

12. The method as claimed in claim 11, wherein the deposited material is a metal alloy, a semi-metal alloy, a metal nitride, a metal oxide, a metal carbide, an antimonide, a phosphide, a boride, or a combination thereof.

13. The method as claimed in claim 11, wherein (i) a difference in surface energy between the first and second materials or material compositions is less than 50%, or (ii) if the difference in surface energy is greater, then the material or material composition having lower surface energy is grown on the material or material composition having higher surface energy.

14. The method as claimed in claim 11, wherein activation of the first target is achieved by a first activation pulse train consisting of a first number of activation pulses and wherein activation of the second target is achieved by a second activation pulse train consisting of a second number of activation pulses.

15. The method as claimed in claim 14, wherein the first number of activation pulses is different from the second number of activation pulses.

16. A method of coating a substrate so as to provide a controlled in-plane compositional modulation, comprising:
providing a first target of a first material or material composition,
providing a second target of a second material or material composition, different from the first material or material composition;
activating the first and second targets to release particles by evaporation, sublimation or sputtering; and
causing the released particles to impinge onto the substrate such that the substrate is coated; and
wherein activation of one of the targets includes providing a series of activation pulses, such that pulsed evaporation, sublimation or sputtering of particles is provided, while the other one of the targets is substantially passive;
wherein the first and second target materials or material compositions present:
a respective homologous temperature, defined as a ratio of the substrate temperature to the target material or material composition melting temperature of the target material or material composition having the lowest melting temperature,
a miscibility, as defined by a mixing enthalpy of the target materials or material compositions,
wherein the mixing enthalpy of the materials or material compositions greater than zero is defined as immiscible and a mixing enthalpy of the materials or material compositions less than zero is defined as miscible,
wherein the target materials or material compositions present three-dimensional growth, whereby the first target material or material composition presents three-dimensional growth on the second target material or material composition and the second material or material composition presents two-dimensional growth on the first target material or material composition;
wherein the homologous temperature is greater than 0.1 and less than 0.4;
wherein the amount of material deposited per pulse train from each target material or material composition is greater than 0.1 monolayer and less than 50 monolayers, and
wherein the target materials or material compositions are miscible.

17. The method as claimed in claim 16, wherein the second target material or material composition has a difference in surface energy from the first target material or material composition that is less than 50%, or if the difference in surface energy is greater, then the second material or material composition has a lower surface energy than the first material or material composition.

18. The method as claimed in claim 16, wherein the deposited material is a metal alloy, a semi-metal alloy, a metal nitride, a metal oxide, a metal carbide, an antimonide, a phosphide, a boride, or a combination thereof.

19. The method as claimed in claim 16, wherein activation of the first target is achieved by a first activation pulse train consisting of a first number of activation pulses and wherein activation of the second target is achieved by a second activation pulse train consisting of a second number of activation pulses.

20. The method as claimed in claim 19, wherein the first number of activation pulses is different from the second number of activation pulses.

21. The method as claimed in claim 12, wherein the metal alloy is molybdenum-niobium alloy, chromium-vanadium alloy, or platinum-rhenium alloy; the semi-metal alloy is silicon-germanium alloy; the metal nitride is titanium zirconium nitride or vanadium niobium nitride; the metal oxide is zirconium yttrium oxide; and the metal carbide is titanium zirconium carbide.

22. The method as claimed in claim 18, wherein the metal alloy is silver-palladium alloy; the metal nitride is chromium hafnium nitride; and the metal carbide is manganese tantalum carbide.

\* \* \* \* \*